United States Patent [19]
Komatsu et al.

[11] Patent Number: 5,083,126
[45] Date of Patent: Jan. 21, 1992

[54] ANALOG-TO-DIGITAL CONVERTER

[75] Inventors: Yoshihiro Komatsu; Youji Yoshii; Daisuke Murakami, all of Kanagawa, Japan

[73] Assignee: Sony Corporation, Tokyo, Japan

[21] Appl. No.: 427,705

[22] Filed: Oct. 27, 1989

[30] Foreign Application Priority Data

Nov. 4, 1988 [JP] Japan .................. 63-277288

[51] Int. Cl.$^5$ .......................................... H03M 1/14
[52] U.S. Cl. ................................... 341/156; 341/118
[58] Field of Search .................. 341/118, 156, 159

[56] References Cited

U.S. PATENT DOCUMENTS

| | | | |
|---|---|---|---|
| 4,214,233 | 7/1980 | Shaw et al. | |
| 4,218,675 | 8/1980 | Shaw et al. | |
| 4,533,903 | 6/1985 | Yamada et al. | |
| 4,535,319 | 8/1985 | Penney | 341/156 |
| 4,544,917 | 10/1985 | Lenhoff, Jr. | 341/158 |
| 4,559,523 | 12/1985 | Wakita | 341/156 |
| 4,568,910 | 4/1986 | Sekino et al. | |
| 4,599,599 | 8/1986 | Sekino et al. | |
| 4,618,850 | 10/1986 | Lenhoff, Jr. | 341/155 |
| 4,903,028 | 2/1990 | Fukushima | 341/156 |

FOREIGN PATENT DOCUMENTS 0070734 1/1983 European Pat. Off. .
61-144127 1/1986 Japan .

Primary Examiner—J. R. Scott
Assistant Examiner—Marc S. Hoff
Attorney, Agent, or Firm—Ronald P. Kananen

[57] ABSTRACT

Disclosed is a series-parallel type analog-to-digital converter having an analog signal first digitized through coarse quantization to thereby obtain a high-order converted code, and then, the quantization error of the high-order converted code digitized to thereby obtain a low-order converted code, in which it is adapted such that low-order converted codes are sequentially classified into three groups, and when a specific group is output as a redundancy code, a correction code for correcting the high-order converted code is output from the low-order encoder providing the converted code of that group.

3 Claims, 25 Drawing Sheets

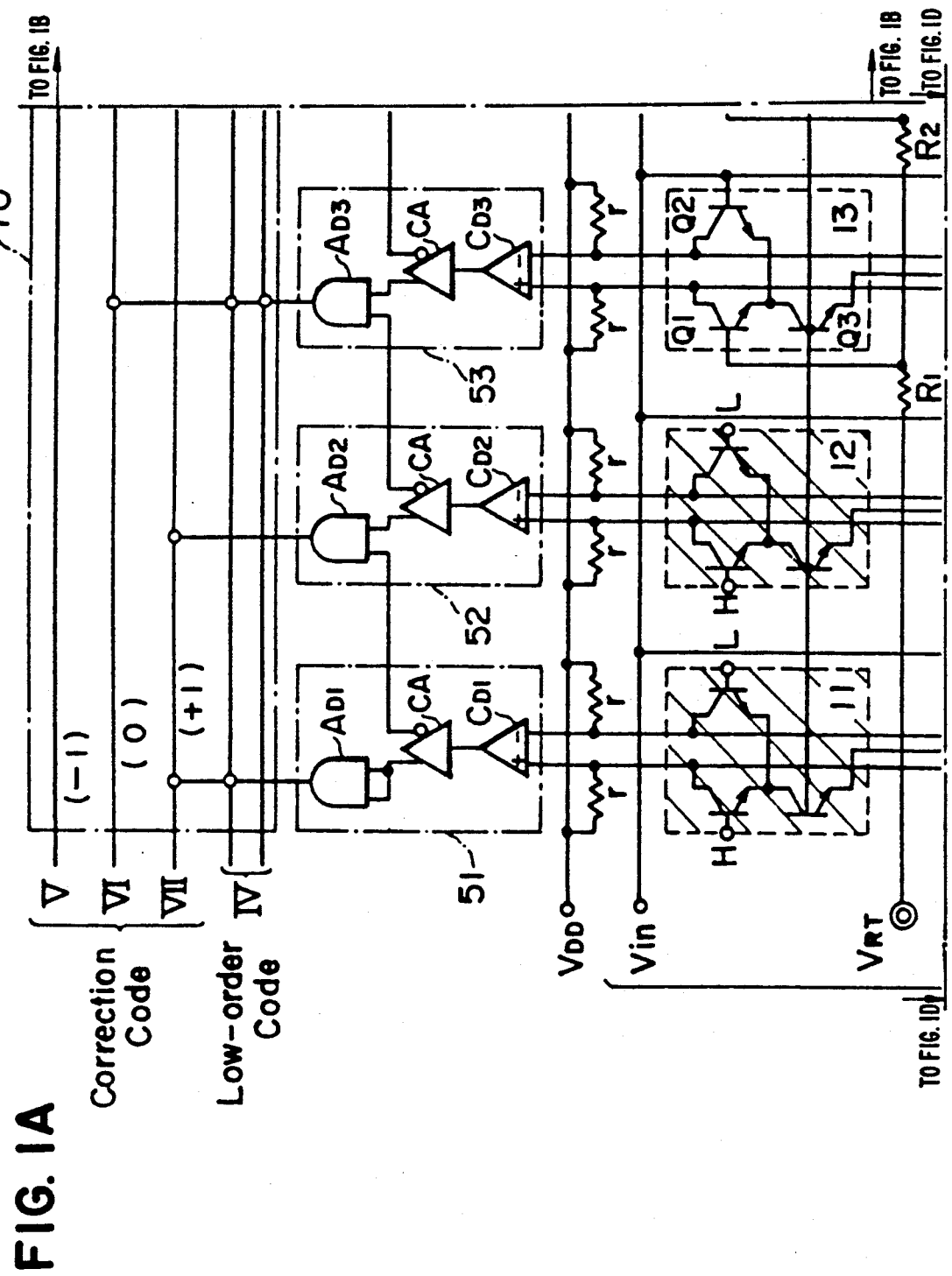
FIG. IA

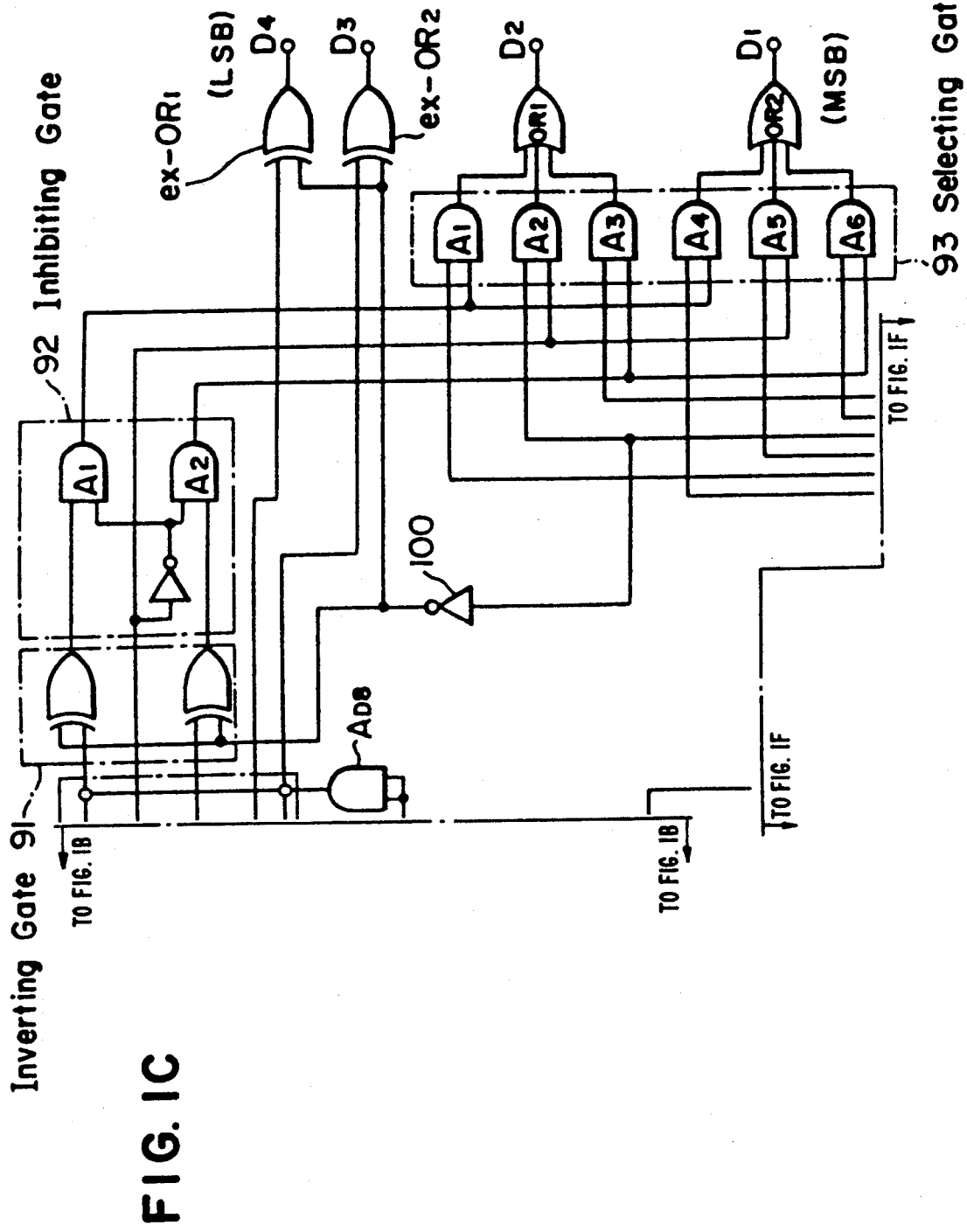
FIG. IC

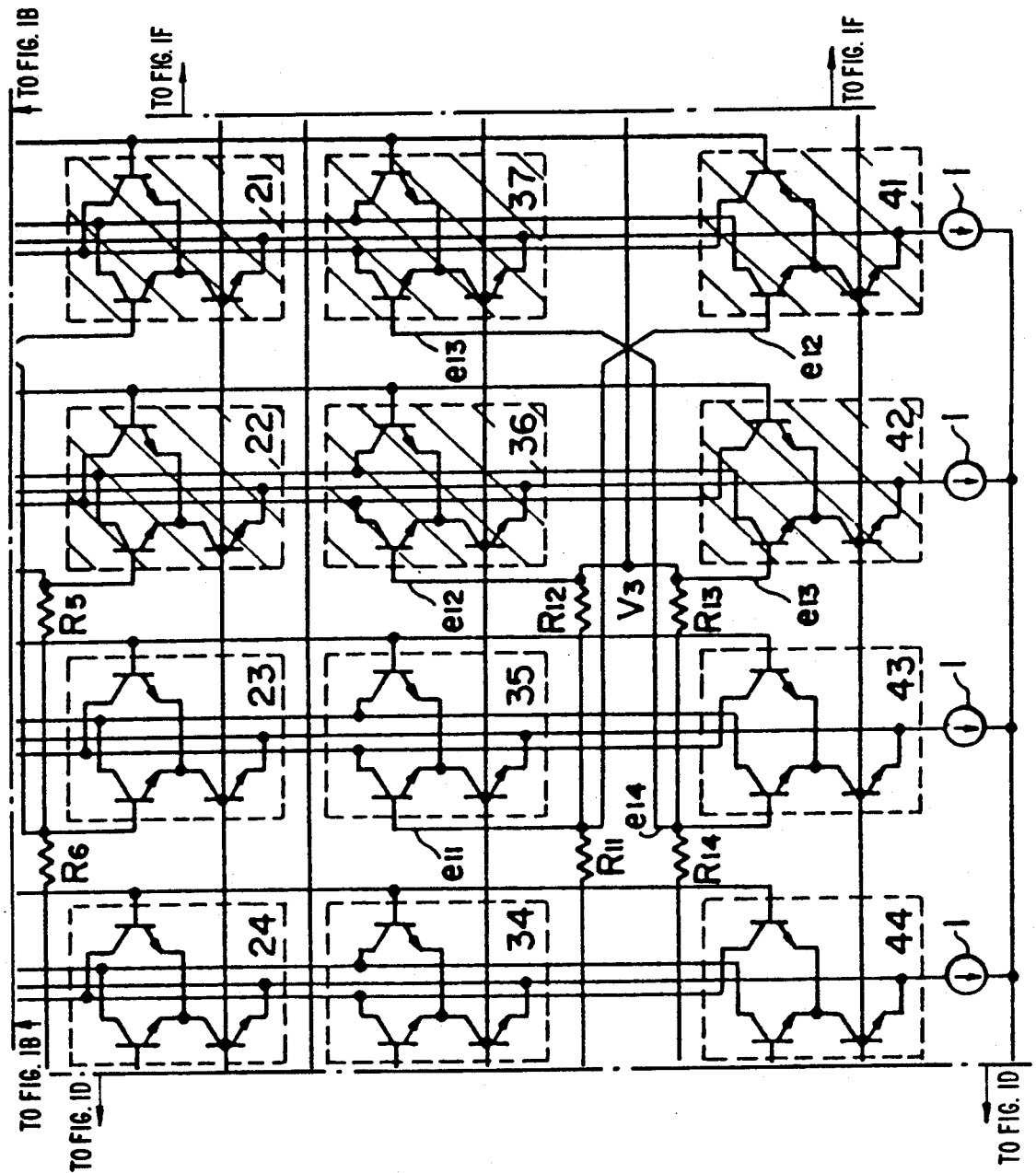
FIG. IE

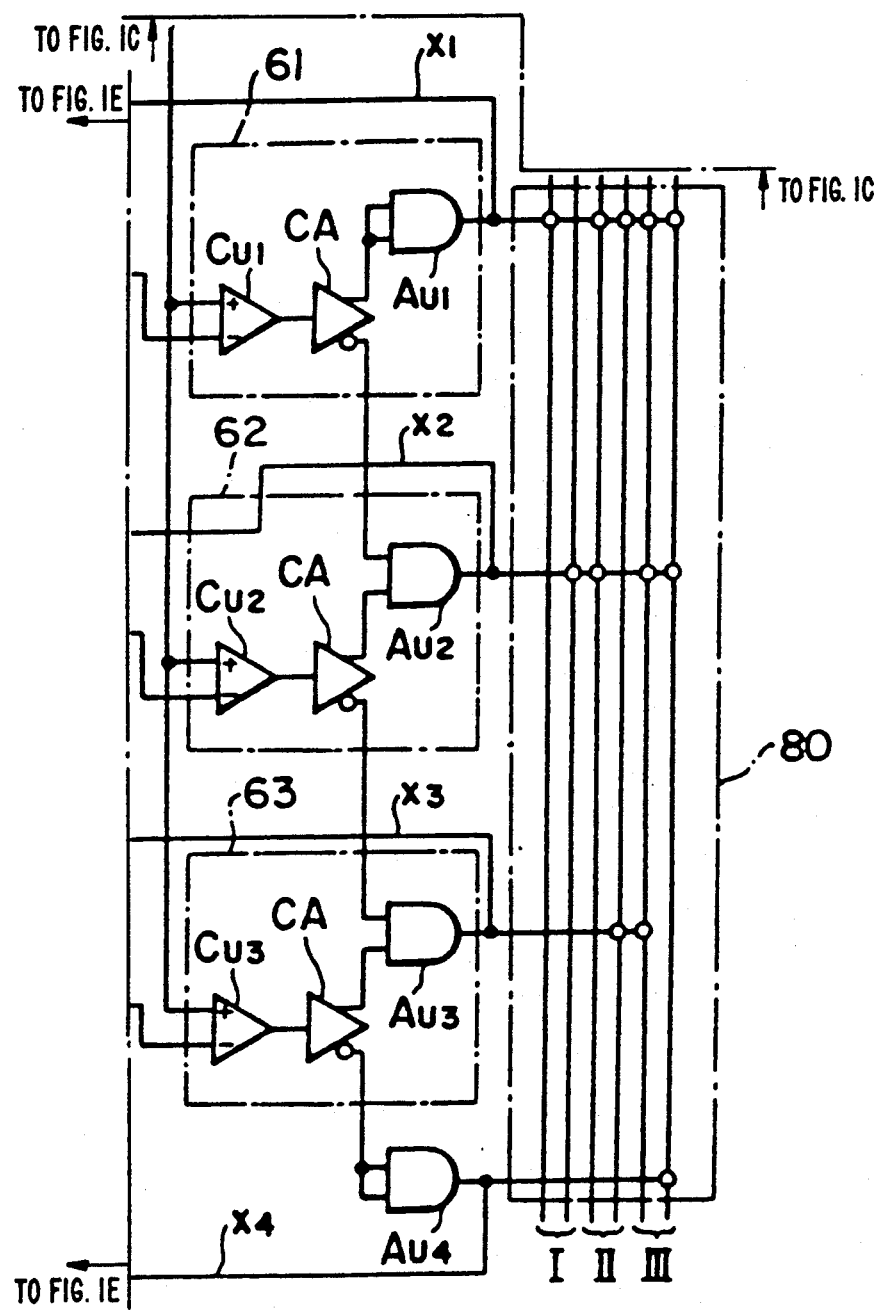
FIG. IF

FIG. 2

| Comparator Output | | | | Line Output | | |
|---|---|---|---|---|---|---|
| $A_{U1}$ | $A_{U2}$ | $A_{U3}$ | $A_{U4}$ | I | II | III |
| 0 | 0 | 0 | 1 | 0 0 | 0 0 | 0 1 |
| 0 | 0 | 1 | 0 | 0 0 | 0 1 | 1 0 |
| 0 | 1 | 0 | 0 | 0 1 | 1 0 | 1 1 |
| 1 | 0 | 0 | 0 | 1 0 | 1 1 | 1 1 |

High-order Converted Code

FIG. 3

| Low-order Comparator Output | | | | | | | | $D_3 \cdot D_4$ | Correction Signal | | |
|---|---|---|---|---|---|---|---|---|---|---|---|
| $A_{D1}$ | $A_{D2}$ | $A_{D3}$ | $A_{D4}$ | $A_{D5}$ | $A_{D6}$ | $A_{D7}$ | $A_{D8}$ | IV | V | VI | VII |
| 0 | 0 | 0 | 0 | 0 | 0 | 0 | 1 | 1 0 | 1 | 0 | 0 |
| 0 | 0 | 0 | 0 | 0 | 0 | 1 | 0 | 1 1 | 1 | 0 | 0 |
| 0 | 0 | 0 | 0 | 0 | 1 | 0 | 0 | 0 0 | 0 | 1 | 0 |
| 0 | 0 | 0 | 0 | 1 | 0 | 0 | 0 | 0 1 | 0 | 1 | 0 |
| 0 | 0 | 0 | 1 | 0 | 0 | 0 | 0 | 1 0 | 0 | 1 | 0 |
| 0 | 0 | 1 | 0 | 0 | 0 | 0 | 0 | 1 1 | 0 | 1 | 0 |
| 0 | 1 | 0 | 0 | 0 | 0 | 0 | 0 | 0 0 | 0 | 0 | 1 |
| 1 | 0 | 0 | 0 | 0 | 0 | 0 | 0 | 0 1 | 0 | 0 | 1 |

Low-order Converted Code

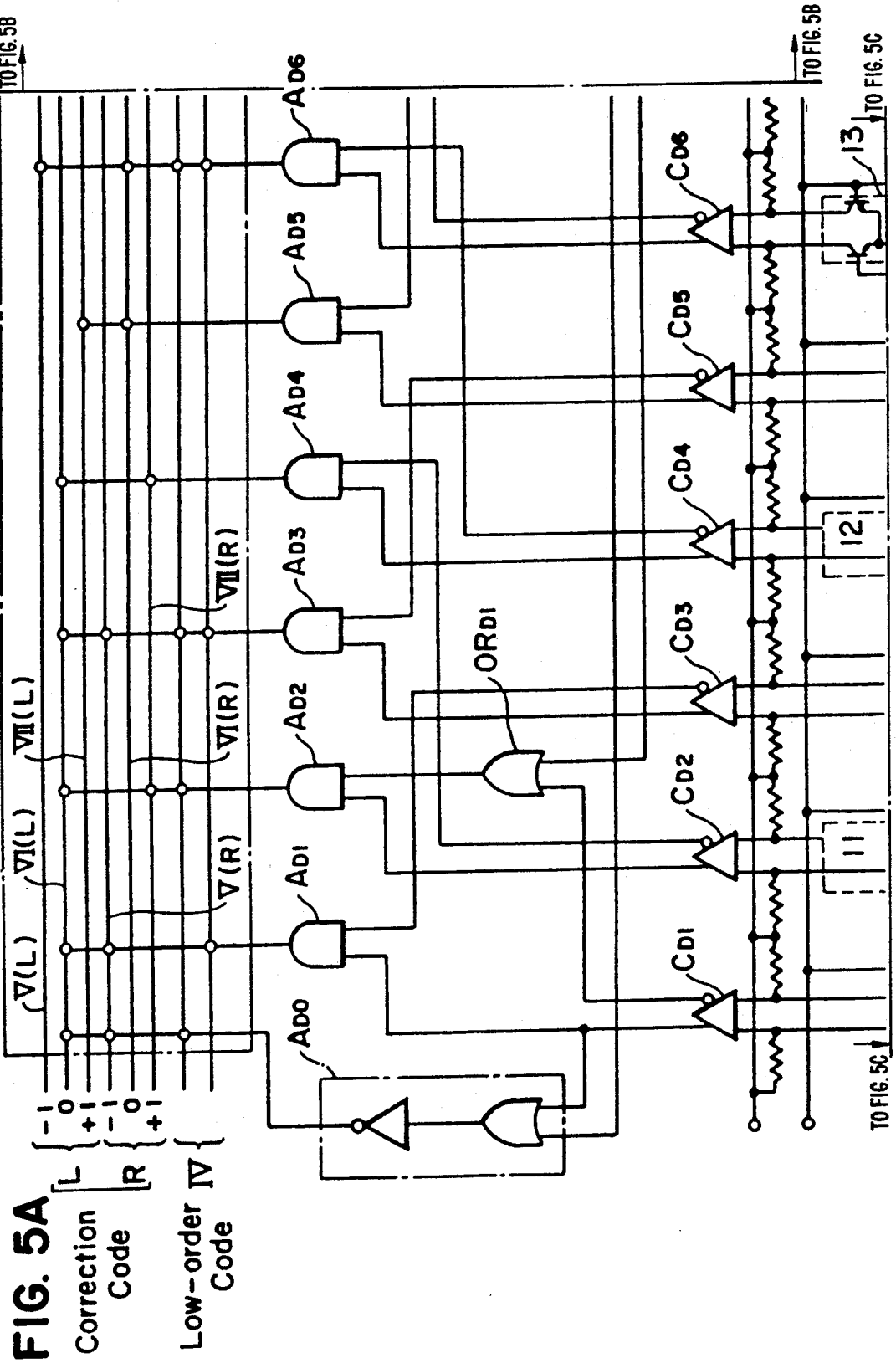

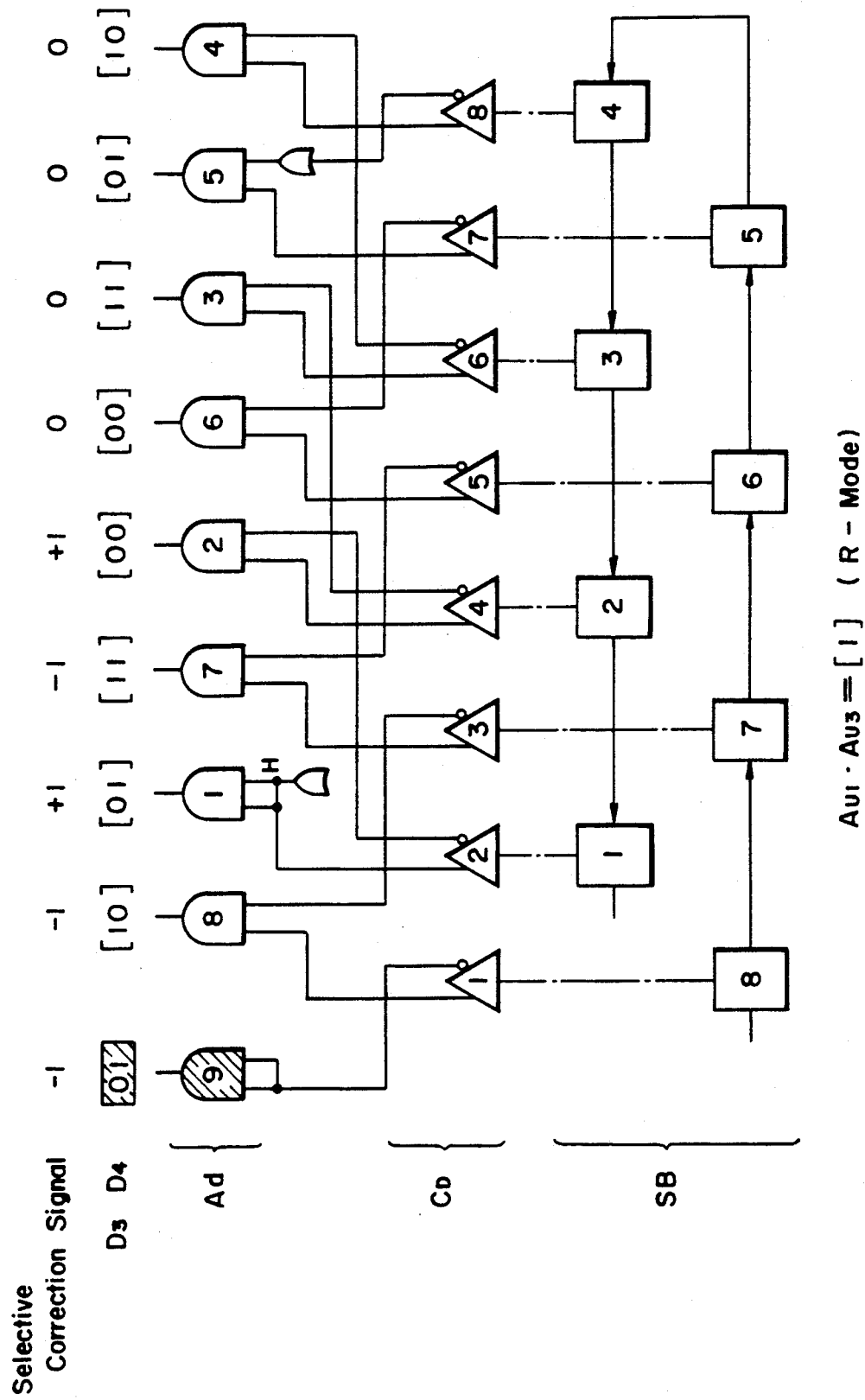

FIG.7

| Switching Block | AND Gate | IV | V | VI | VII |
|---|---|---|---|---|---|
| 1 2 3 4 5 6 7 8 | 1 2 3 4 5 6 7 8 9 | D₃·D₄ | -1 | 0 | -1 +1 |
| H H H H H H H H | 1 0 0 0 0 0 0 0 0 | 1 0 | 0 | 0 | - |
| L H H H H H H H | 0 1 0 0 0 0 0 0 0 | 0 1 | 0 | 0 | - |
| L L H H H H H H | 0 0 1 0 0 0 0 0 0 | 1 0 | 0 | - | 0 |
| L L L H H H H H | 0 0 0 1 0 0 0 0 0 | 0 1 | 0 | - | 0 |
| L L L L H H H H | 0 0 0 0 1 0 0 0 0 | 1 0 | 0 | - | 0 |
| L L L L L H H H | 0 0 0 0 0 1 0 0 0 | 0 1 | 0 | - | 0 |
| L L L L L L H H | 0 0 0 0 0 0 1 0 0 | 1 0 | - | 0 | 0 |
| L L L L L L L H | 0 0 0 0 0 0 0 1 0 | 0 1 | - | 0 | 0 |
| L L L L L L L L | 0 0 0 0 0 0 0 0 1 | 1 0 | - | 0 | 0 |

Redundancy Bit / Low-order Bit / Redundancy Bit

Vin ←

FIG. 9

| | High Order | Low Order | | |
|---|---|---|---|---|
| | D₁ | D₂ | D₃ | D₄ |

| | D₁ | D₂ | D₃ | D₄ | |
|---|---|---|---|---|---|
| Au1 | 1 | 1 | 1 | 1 | } C |
| | 1 | 1 | 1 | 0 | |
| | 1 | 1 | 0 | 1 | } B |
| | 1 | 1 | 0 | 0 | |
| Au2 | 1 | 0 | 1 | 1 | } B |
| | 1 | 0 | 1 | 0 | |
| | 1 | 0 | 0 | 1 | } A |
| | 1 | 0 | 0 | 0 | |
| Au3 | 0 | 1 | 1 | 1 | } C |
| | 0 | 1 | 1 | 0 | |
| | 0 | 1 | 0 | 1 | } B |
| | 0 | 1 | 0 | 0 | |
| Au4 | 0 | 0 | 1 | 1 | } B |
| | 0 | 0 | 1 | 0 | |
| | 0 | 0 | 0 | 1 | } A |
| | 0 | 0 | 0 | 0 | |

FIG.11

| | High Order | Low Order | | | | | | | | High Order | Low Order | | | | |
|---|---|---|---|---|---|---|---|---|---|---|---|---|---|---|---|
| | $D_1$ $D_2$ | $D_3$ $D_4$ $D_5$ $D_6$ | | | | I(A) II(B) III(C) | | $D_1$ $D_2$ | $D_3$ $D_4$ $D_5$ $D_6$ | | | |

C { 1 1 | 1 1 1 1
    1 1 | 1 1 1 0
    1 1 | 1 1 0 1
    1 1 | 1 1 0 0

$A_{u1}$ | — — 1 1 1 1

0 1 | 1 1 1 1
    0 1 | 1 1 1 0  } C
    0 1 | 1 1 0 1
    0 1 | 1 1 0 0

B { 1 1 | 1 0 1 1
    1 1 | 1 0 1 0
    1 1 | 1 0 0 1
    1 1 | 1 0 0 0

$A_{u2}$ | 1 1 1 1 1 0

0 1 | 1 0 1 1
    0 1 | 1 0 1 0  } B
    0 1 | 1 0 0 1
    0 1 | 1 0 0 0

B { 1 1 | 0 1 1 1
    1 1 | 0 1 1 0
    1 1 | 0 1 0 1
    1 1 | 0 1 0 0

$A_{u3}$ | 1 1 1 0 1 0

0 1 | 0 1 1 1
    0 1 | 0 1 1 0  } B
    0 1 | 0 1 0 1
    0 1 | 0 1 0 0

A { 1 1 | 0 0 1 1
    1 1 | 0 0 1 0
    1 1 | 0 0 0 1
    1 1 | 0 0 0 0

$A_{u4}$ | 1 0 1 0 0 1

0 1 | 0 0 1 1
    0 1 | 0 0 1 0  } A
    0 1 | 0 0 0 1
    0 1 | 0 0 0 0

C { 1 0 | 1 1 1 1
    1 0 | 1 1 1 0
    1 0 | 1 1 0 1
    1 0 | 1 1 0 0

$A_{u5}$ | 1 0 0 1 0 1

0 0 | 1 1 1 1
    0 0 | 1 1 1 0  } C
    0 0 | 1 1 0 1
    0 0 | 1 1 0 0

B { 1 0 | 1 0 1 1
    1 0 | 1 0 1 0
    1 0 | 1 0 0 1
    1 0 | 1 0 0 0

$A_{u6}$ | 0 1 0 1 0 0

0 0 | 1 0 1 1
    0 0 | 1 0 1 0  } B
    0 0 | 1 0 0 1
    0 0 | 1 0 0 0

B { 1 0 | 0 1 1 1
    1 0 | 0 1 1 0
    1 0 | 0 1 0 1
    1 0 | 0 1 0 0

$A_{u7}$ | 0 1 0 0 0 0

0 0 | 0 1 1 1
    0 0 | 0 1 1 0  } B
    0 0 | 0 1 0 1
    0 0 | 0 1 0 0

A { 1 0 | 0 0 1 1
    1 0 | 0 0 1 0
    1 0 | 0 0 0 1
    1 0 | 0 0 0 0

$A_{u8}$ | 0 0 0 0 — —

0 0 | 0 0 1 1
    0 0 | 0 0 1 0  } A
    0 0 | 0 0 0 1
    0 0 | 0 0 0 0

FIG. 13
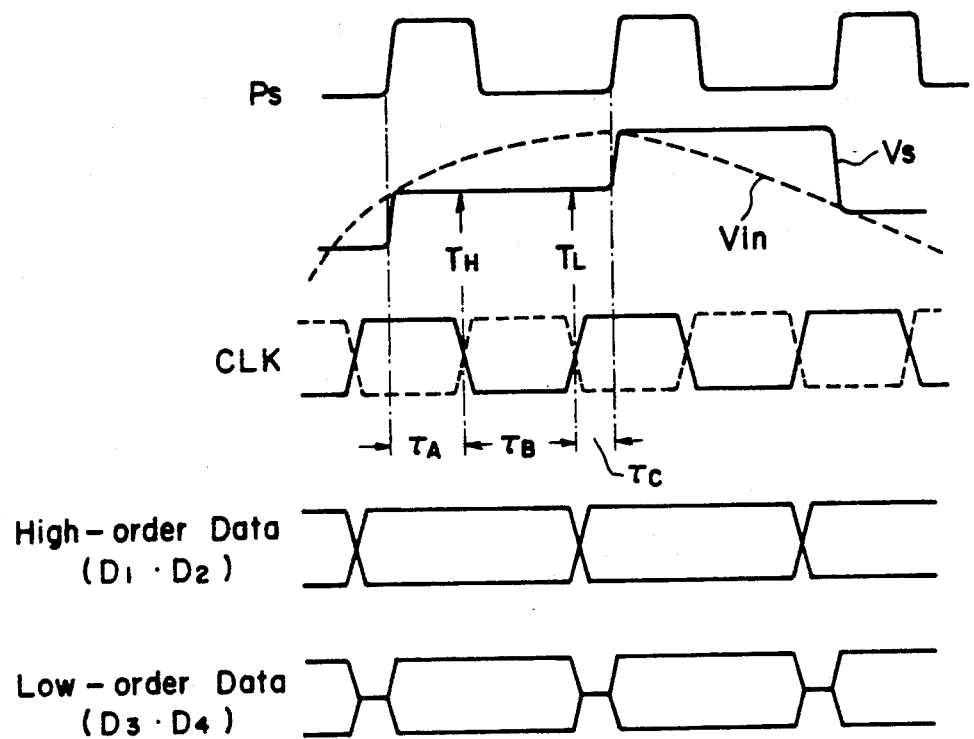
FIG. 14A
FIG. 14B
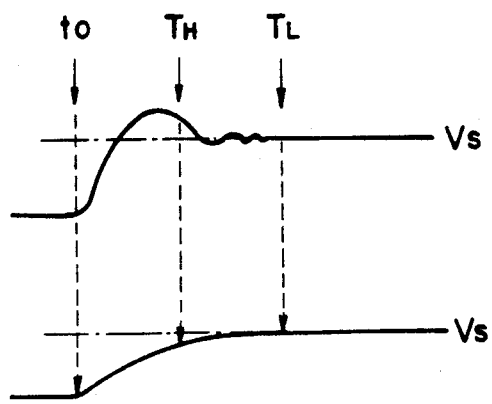

ANALOG-TO-DIGITAL CONVERTER

BACKGROUND OF THE INVENTION

1. Field of the Invention

The present invention relates to an analog-to-digital (A/D) converter for converting an analog signal to a digital signal, and more particularly relates to a series-parallel type A/D converter for converting an analog signal to a digital signal in two steps for high-order code and low-order code.

2. Description of the Prior Art

There have so far been proposed various conversion systems of A/D converters for converting an analog signal to a digital signal. Generally, what are widely used are flash type (parallel type) A/D converters, wherein an analog signal is quantized so that its amplitude is divided into the same number of levels as that of bits for conversion and such quantized signals are input to a plurality of comparators to thereby obtain the converted digital code.

Although high-speed operation of such parallel-type A/D converter is possible in principle, at least $2^n - 1$ comparators become necessary when the number of bits of conversion is set to n, i.e., 255 comparators become necessary, for example, when eight-bit converted codes are desired. Hence, in order to obtain digital codes with high resolution, it becomes necessary to arrange tens of thousands of active elements in an IC.

Therefore, there has been proposed in U.S. Pat. No. 4,533,903, assigned to a common assignee, an A/D converter in which it is adapted, in converting an analog signal to an n-bit digital signal, such that the analog signal is first digitized by coarse quantization to thereby obtain a high-order a-bit converted code inclusive of the MSB, and then, in order to reduce an error in the high-order converted code, i.e., a quantization noise, the range of the high-order quantization is divided into finer ranges and finely digitized, and thereby, a low-order $b(=n-a)$-bit converted code inclusive of the LSB is obtained.

FIG. 12 is a block diagram schematically showing such new series-parallel type A/D converter (hereinafter to be referred to as a series-parallel type A/D converter). In the figure, a circuit configuration for converting an analog signal to a four-bit digital code is shown.

Referring to the figure, $R_1-R_{16}$ denote reference resistors connected in series between terminals of reference potentials $V_{RT}-V_{RB}$ (0-2 V), $C_{U1}-C_{U3}$ denote high-order comparators in which one input terminal is supplied with an analog signal $V_{in}$ to be converted and the other input terminals are supplied with reference voltages ($V_1$, $V_2$, $V_3$) as quantization levels coarsely divided by reference resistors $R_1-R_{16}$, and $C_{D1}-C_{D3}$ denote low-order comparators of which one input terminal is similarly supplied with the analog signal $V_{in}$ and the other input terminals are supplied respectively with reference voltages finely divided by the reference resistors $R_1-R_{16}$ through switches $S_1-S_{12}$.

The portion $E_1$ encircled with a chain line denotes a first encoder for encoding a binary signal output from the high-order comparator $C_{U1}-C_{U3}$ to thereby convert it to, for example, a two-bit binary code (or a twos complement code), and $E_2$ denotes a second encoder for similarly converting a binary signal output from the low-order comparator $C_{D1}-C_{D3}$ to a two-bit binary code.

The first encoder $E_1$ comprises complementing output amplifiers $CA_1-CA_3$, AND gates $A_1-A_4$, and a ROM circuit. Therein, it is adapted such that when a signal at a "1" level is output from the AND gate $A_1$, the switches $S_1-S_3$ are controlled to be turned ON and when a signal at a "1" level is output from the AND gate $A_2$, the switches $S_4-S_6$ are turned ON. Further, in like manner, the switches $S_7-S_9$ and the switches $S_{10}-S_{12}$ are controlled to be turned ON by the outputs from the AND gates $A_3$ and $A_4$, respectively.

The described series-parallel type A/D converter is driven, for example, such that, as shown in FIG. 13, when an analog signal $V_{in}$ is sampled at the leading edge of a sampling pulse $P_S$ and the sampled voltage $V_S$ is supplied to the first encoder $E_1$, the same is operated at the point of time $T_H$ at the trailing edge of a clock signal CLK (the point delayed by $\tau_A$) to convert the binary signal output of the high-order comparator $C_{U1}-C_{U3}$ to a high-order two-bit code signal $D_1$, $D_2$ and deliver the same, and the value of the same sampled voltage $V_S$ is converted to a low-order code signal $D_3$, $D_4$ by the second encoder $E_2$ which is operated at the point of time $T_L$ at the leading edge of the clock signal CLK (the point delayed by $\tau_B$).

More particularly, the reference voltages $V_1$, $V_2$, and $V_3$ obtained by dividing the reference voltage $V_{RT}-V_{RB}$ are first compared with the sampled voltage $V_S$ in the high-order comparators $C_{U1}-C_{U3}$, and if $V_3 < V_S < V_2$, then the output of the high-order comparator $C_{U3}$ goes to a high potential (H) while those of the high-order comparators $C_{U1}$ and $C_{U2}$ go to a low potential (L).

Then, the output of the AND gate $A_3$ only becomes "1", while other AND gates $A_1$, $A_2$, and $A_4$ show a value "0".

As a result, [01] is output from the first encoder $E_1$ as the high-order two-bit converted code.

Then, with the high-order two-bit converted code latched, a control signal is output from the AND gate $A_3$ so that the switches $S_7-S_9$ are turned ON.

Then, the sampled analog signal at the level $V_3 < V_S < V_2$ is further compared with the reference voltages $V_{23-1}$, $V_{23-2}$, and $V_{23-3}$ divided by the resistors $R_9-R_{12}$ in the low-order comparators $C_{D1}-C_{D3}$. If $V_{23-1} > V_S > V_{23-2}$, then a low-order two-bit converted code [10] is output from the second encoder $E_2$.

As a result, a four-bit converted code [0110] of the analog signal $V_{in}$ is output from the first and second encoders $E_1$ and $E_2$.

The above described series-parallel type A/D converter is adapted to output the converted code divided in the high-order two-bit code and the low-order two-bit order, and therefore, the number of required comparators for four-bit A/D conversion can be reduced to six. When, for example, an eight-bit A/D conversion has to be made, 255 comparators are required in the case of parallel-type A/D converters. But, in the case of the above described system, the high-order code and the low-order code can be made in four bits each, and therefore, such an effect can be obtained that the required number of the comparators can be reduced to $(2^4-1) \times 2 = 30$.

However, since the converted code is obtained in two steps, the below described problem occurs, in particular, when a high sampling frequency is used.

When an analog signal is sampled at a high frequency, a steady sampled voltage $V_S$ cannot be obtained in general just at the point of time of sampling $t_0$, but, frequently, an overshoot occurs at the early stage or a considerable length of settling time is required as shown in FIGS. 14(a) and (b) dependent on the response of the sampling circuit. In addition thereto, an effect (kickback) of the clock signal for driving the A/D converter causes variations in the sampled voltage $V_S$.

As a result, it occurs that the sampled voltage differs between the point of time $T_H$ at which the high-order converted code is output and the point of time $T_L$ at which the low-order converted code is output.

In such situation, setting aside the case where the analog signal $V_{in}$ is in the middle of the high-order two-bit quantization levels as exemplified in the description of the four-bit A/D converter given above, it poses a problem when the level of the signal is in the vicinity of any of the quantization levels, for example, very close to the level of the reference voltages $V_1$, $V_2$, or $V_3$.

For example, when the true value of a converted code of an analog signal is [0111], if there is produced an error of one LSB at the point of time of high-order conversion $T_H$, then the high-order two bits can become [10], and since the low-order comparators according to this converted code [10] are selected, the obtained value may change to [1000].

Therefore, in the case where the settling characteristic of the sampling circuit is bad, the high-order two-bit code converted at relatively early timing is liable to be changed from [01] to [10] when the code is such as mentioned in the above example. Thus, such a problem is posed that the conversion linearity is generally bad in the vicinity of the high-order quantization level.

SUMMARY OF THE INVENTION

In view of the above mentioned problem, an A/D converter of the present invention, in a series-parallel type A/D converter, wherein an analog signal is first digitized through coarse quantization to obtain a high-order converted code and a quantization error in such high-order converted code is then digitized to obtain a low-order converted code, is adapted such that the width of the digitized level of low-order conversion is expanded to thereby make the correction of the high-order converted code achievable and at the same time make the circuit arrangement in IC of the A/D converter facilitated.

Accordingly, it is the primary object of the present invention to provide a series-parallel type A/D converter in which correction of the high-order converted code can be simply performed.

It is another object of the present invention to provide a series-parallel type A/D converter wherein the configuration of the circuit providing the signal for correcting the high-order converted code is simplified.

To achieve the above enumerated objects, the series-parallel type A/D converter according to the present invention is structured such that an analog signal is first digitized for high-order conversion bits by means of its switching blocks in a matrix array and high-order comparators disposed in the direction of the lines of the switching blocks, and the analog signal is then digitized for low-order conversion bits by means of the switching blocks in the matrix array and its low-order comparators disposed in the direction of the rows of the switching blocks, wherein the number of the bits for the low-order conversion is set to be larger than the number of the bits for the high-order conversion so that, when the data output as a low-order converted code is different from the data of a high-order converted code, the data of the high-order converted code is forcedly corrected, and wherein the points of application of reference voltage are shifted by half a period so that the wiring for the matrix circuit is simplified.

The series-parallel type A/D converter according to the present invention is structured such that an analog signal is first digitized for high-order conversion bits by means of its switching blocks in a matrix array and high-order comparators disposed in the direction of the lines of the switching blocks, and the analog signal is then digitized for low-order conversion bits by means of the switching blocks in the matrix array and its low-order comparators disposed in the direction of the rows of the switching blocks, wherein it is adapted such that the low-order converted code obtained from the low-order comparator is classified into three groups and, when a redundancy code of a specific group is output, the data of the high-order converted code is corrected by a correction signal included in the specific group, and wherein it is adapted such that the LSB of the high-order converted code is obtained from the low-order comparator.

BRIEF DESCRIPTION OF THE DRAWINGS

FIG. 2 and FIG. 3 are pattern diagrams showing high-order and low-order converted codes;

FIG. 6A and FIG. 6B are explanatory drawings of a low-order converting circuit of a series-parallel type A/D converter according to the present invention;

FIG. 7 is a data diagram of converted codes and correction signals;

FIG. 9 is an explanatory diagram showing a grouping of low-order converted codes;

FIG. 11 is an explanatory diagram of a grouping for six-bit converted codes and high-order converted codes;

FIG. 13 is a waveform chart for timing of sampling; and

FIGS. 14A and 14B shows waveform charts for sampling.

DESCRIPTION OF THE PREFERRED EMBODIMENTS

Figure 1B:
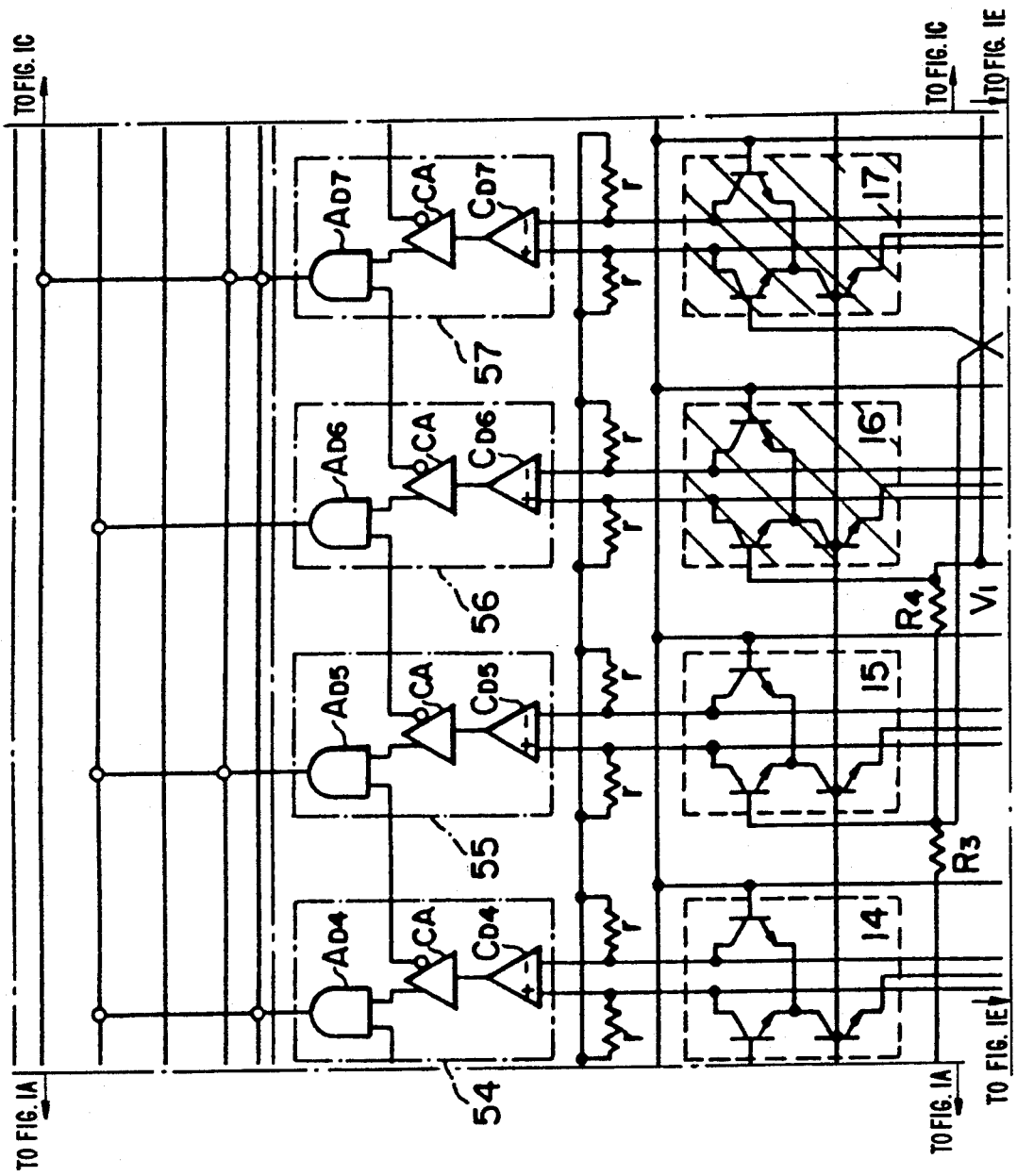
FIG. 1 (comprised of sectioned FIGS. 1A-1F) is a circuit diagram showing an embodiment of an A/D converter as the basis for the present invention.
Figure 1D:
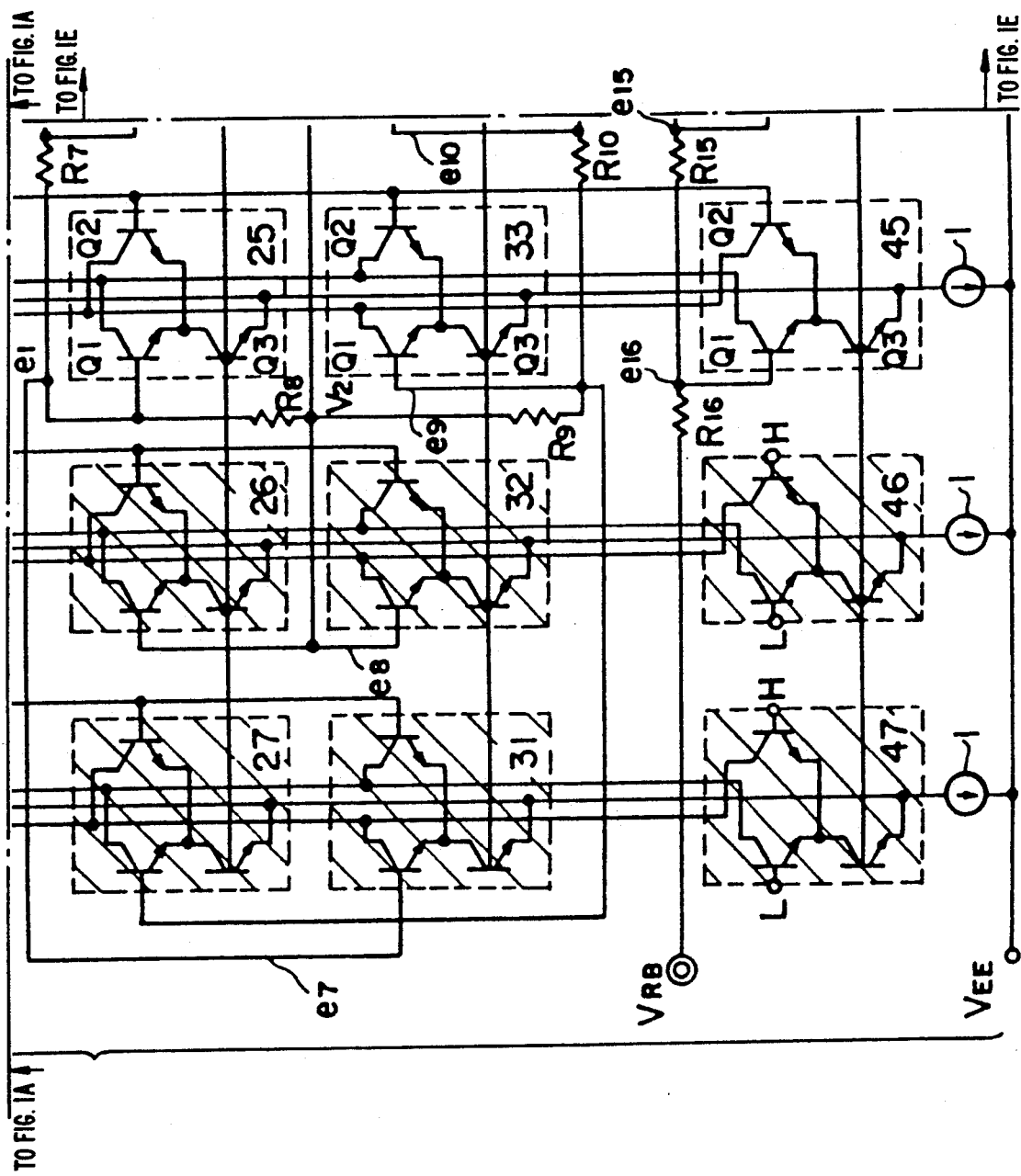

FIG. 1 (comprising sectioned FIGS. 1A-1F). is a circuit diagram showing an embodiment of a series-parallel type A/D converter additionally provided with redundancy bits and forming the basis for the present invention, the principle of which is described in detail in U.S. Patent Application Ser. No. 299,016 filed Jan. 19, 1989, and assigned to a No. 4,903,028 issued on Feb. 20, 1990 and based on common assignee. The figure illustrates a circuit configuration for converting an analog signal $V_{in}$ to a four-bit digital code.

Referring to the figure, reference numerals 11-17, 21-27, 31-37, and 41-47 denote switching blocks in a matrix array, and in the present embodiment, the switching blocks form a 4-line×7-row matrix circuit 10.

Each switching block comprises transistors $Q_1$ and $Q_2$ in the form of a differential amplifier and a transistor $Q_3$. Except for some of them, the transistors $Q_1$ on one side are supplied with reference voltages obtained by dividing the reference voltage $V_{RT}-V_{RB}$ by the reference resistors $R_1-R_{16}$ and the transistors $Q_2$ on the other side are supplied with the analog signal $V_{in}$ to be converted into a digital code. The common-emitters are connected in common with a current source I through the transistor $Q_3$ which makes a switching operation controlled by a later described control signal.

The collectors of the transistors $Q_1$ and $Q_2$ are connected with a power source $V_{DD}$ through a resistor r, and output terminals of the same are input to seven comparators $C_{D1}-C_{D7}$ of low-order comparators 51-57, so that the transistors also serve as preamplifiers for the low-order comparators 51-57.

The transistors $Q_1$ and $Q_2$ in each of the switching blocks are arranged, to minimize the fluctuation in the base-emitter voltage $V_{BE}$, such that the emitter region on the IC substrate has a wider area than other transistor elements, whereby the fluctuation in the voltage $V_{BE}$ is made at least smaller than the quantization level of the LSB of the bits for conversion.

Therefore, the switching blocks in the matrix array occupy a larger region than any other component when arranged on an IC.

The switching blocks 11, 12, 16, 17, 21, 22, 26, 27, 31, 32, 36, 37, 41, 42, 46, and 47 which are slashed in the figure are those for outputting redundancy bits of two LSBs for the low-order two-bit converted code. Of these, the switching blocks 11, 12, 46, and 47 (dummy switching blocks) are particularly adapted, when actuated by a control signal, to be supplied with a fixed input signal so as to output a fixed binary signal, "H" or "L", at all times.

Further, the collectors of the transistors $Q_1$ and $Q_2$ on the second line and the fourth line of the switching blocks, in particular, are connected with the lines reversely to the direction in which the collector outputs of the transistors $Q_1$ and $Q_2$ on the first line and the third line are connected, so that the lines of the series arrangement of the reference resistors $R_1-R_{16}$ to which the reference voltage $V_{RT}-V_{RB}$ is applied can be provided by being folded.

Reference numerals 61, 62, and 63 each denote a high-order comparator comprising a comparator $C_{U1}-C_{U3}$, a complementing output amplifier CA, and an AND gate $A_{U1}-A_{U4}$.

One input of each of the comparators $C_U$ of the high-order comparators 61-63 is supplied with the analog signal $V_{in}$ and the other input is supplied with reference voltage $V_1$, $V_2$, and $V_3$ which are obtained by dividing the reference voltage $V_{RT}-V_{RB}$ into coarse quantization levels as described before. The output of each comparator $C_U$ of the high-order comparators 61-63 is adapted to go to a "H" or an "L" level corresponding to the level of the analog signal subjected to the sampling, whereby only one of the AND gates $A_U$ outputs the signal at a "1" level.

The output signal of the AND gate $A_U$ is converted into a binary code through a first encoder 80 in wired OR connections and supplied to a later described selecting gate 93, wherein the high-order two-bit codes $D_1$ and $D_2$ are subjected to correction.

The low-order comparators 51-57 are of the same configuration as the high-order comparators. Of the same, the low-order comparators 53, 54, and 55 particularly are those for digitizing the quantization level selected by the high-order comparators into a finer value to thereby output the low-order two-bit codes $D_3$ and $D_4$ through a second encoder 70.

In the present A/D converter, on the left and right sides of the low-order comparators, there are provided the comparators 51 and 52 and the comparators 56 and 57 for generating redundancy codes of two LSBs so that an encoding operation can be made on the analog signal $V_{in}$ outside the conversion range of the high-order comparator.

Operation in the above described embodiment when the sampled voltage of the analog signal $V_{in}$ is $V_S$ will be described below.

When, for example, the sampled voltage $V_S$ of the analog signal sampled is $V_{RB}<V_S<V_3$, the outputs of the comparators $C_U$ of the high-order comparators 61, 62, and 63 all go "L", so that the AND gates $A_U$ output a binary signal [0001] from the top down. The signal [0001] is input to the first encoder 80, whereupon, by means of the wired OR circuit, [00] is output from the first two-wire line [I], [00] is output also from the second two-wire line [II], and [01] is output from the third two-wire line [III].

When the sampled voltage $V_S$ is $V_3<V_S<V_2$, a signal [0010] is similarly output from the AND gates $A_{U1}$, $A_{U2}$, $A_{U3}$, and $A_{U4}$ of the high-order comparator, and when this signal is input to the first encoder 80, a high-order converted code of [00] is output from the line [I], [01] is output from the line [II], and [10] is output from the line [III].

Including the following cases of $V_2<V_S<V_1$ and $V_1<V_S<V_{RT}$, the relationships between inputs and outputs of the first encode 80 are shown in FIG. 2.

Then, the transistors $Q_3$ of the switching blocks connected with the control line ($X_1$, $X_2$, $X_3$, $X_4$) led from the AND gate $A_{U(1, 2, 3, 4)}$ whose binary output signal is "H" are controlled to be turned ON, and thereby, finer digitization of the quantization level is performed.

More particularly, in the case where only the AND gate $A_{U3}$ is at the "H" level, for example, the transistors $Q_3$ of the switching blocks 31-37 are turned ON, whereby the divided reference voltages by the reference resistors $R_7-R_{13}$ and the sampled voltage $V_S$ are differentially amplified by the switching blocks 31-37 and compared with each other by the low-order comparators 51-57. Similarly, in the case where AND gate $A_{U2}$ is at the "H" level, the switching block 21-27 are actuated.

In the described manner, in obtaining the low-order converted code, the sampled voltage $V_S$ is compared, for switching blocks on each line, with the divided reference voltages by the reference resistors on that line, and thereby, a binary signal as shown in FIG. 3 is output from the AND gates $A_{D1}-A_{D8}$ of the low-order comparators 51-57, and this binary signal is encoded so that a low-order two-bit converted code $D_3$, $D_4$ is output from the low-order code line [IV]. At the same time, output levels on correction lines V, VI, and VII vary as shown in FIG. 3.

When a signal at the level 1 is output to any of these correction lines V, VI, and VII, the high-order two-bit code $D_1$, $D_2$ from the line I, II, or III is selectively output through OR gates $OR_1$ and $OR_2$ as described in the following ①, ②, and ③.

① In the case where the converted code is such that the level 1 appears on the correction line VI (0 line), that is, where the converted code $D_3$, $D_4$ becomes [00], [01], [10], [11] corresponding to the high-order converted code, the outputs of the AND gates $A_1$ and $A_2$ forming an inhibiting gate 92 become 0, hence the outputs of the AND gates $A_1$, $A_3$, $A_4$, and $A_6$ within the selecting gate 93 become 0, so that the high-order code $D_1$, $D_2$ on the line [II] output from the first encoder 80 is output as it is through the AND gates $A_2$, $A_5$ within the selecting gate 93 and the OR gates $OR_1$, $OR_2$.

This case ① is where the level of the analog signal when the high-order two-bit converted code was output has been kept unchanged until when the low-order two-bit converted signal is output. Hence, no correction is made.

② In the case where the converted code is such that the level 1 appears on the correction line V ($-1$ line), the output of the AND gate $A_1$ included in the inhibiting gate 92 becomes 1 and hence the AND gates $A_1$ and $A_4$ within the selecting gate 93 are opened. As a result, the high-order two-bit code $D_1$, $D_2$ on the line [I] input to the AND gates $A_1$, $A_4$ is output through the OR gates $OR_1$, $OR_2$.

Figure 4:
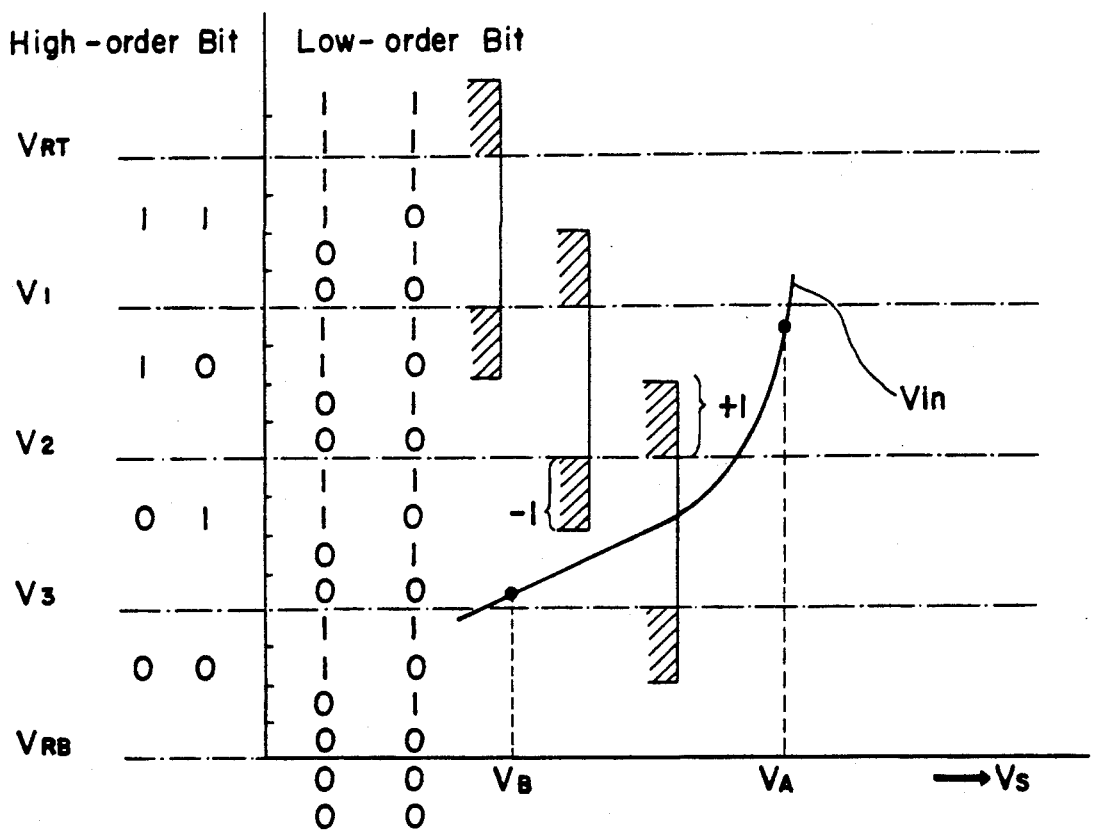
FIG. 4 (comprised of sectioned FIGS. 5A-5D) is a diagram showing relationships between the quantization level and the converted code.

This case ② is where the sampled level of the analog signal when the high-order two-bit code $D_1$, $D_2$ was digitized is higher than the sampled level of the analog signal when the low-order two-bit code $D_3$, $D_4$ is digitized, and hence a correction is made. For example, if the high-order two-bit converted code was wrongly output as [11] when the true value of the sampled value $V_S$ was $V_A$ as shown in FIG. 4, and if the low-order comparator then outputs a correct low-order two-bit converted code [11], then, the right code output [1011] is obtained with the high-order two-bit converted code [11] corrected to [10] by substracting 1 therefrom. In this case, though the line of the switching blocks was wrongly selected by the control line, the high-order two-bit converted code can be corrected because of the right-hand low-order comparator 57 for detecting the redundancy bits outputs [11].

③ In the case where the converted code is such that level 1 appears on the correction line VII ($+1$ line), the output of the AND gate $A_2$ included in the inhibiting gate 92 becomes 1 and hence the AND gates $A_3$ and $A_6$ within the selecting gate 93 are opened. As a result, the high-order two-bit code $D_1$, $D_2$ on the line III input to the AND gates $A_3$, $A_6$ is output through the OR gates $OR_1$, $OR_2$, whereby +1 is added to the high-order two-bit code.

This case ③ is where the sampled level of the analog signal when the high-order two-bit code $D_1$, $D_2$ was digitized is lower than the range of the sampled level of the analog signal when the low-order two-bit code $D_3$, $D_4$ is digitized, and hence a correction is made. For example, if the high-order two-bit code was output as [00] when true value of the analog signal was $V_B$ as shown in FIG. 4, and if the low-order comparator then outputs a low-order two-bit converted code [00], then, +1 is added to the high-order two-bit [00] to obtain [01] and a code [0100] corresponding to the correct sampled voltage $V_B$ is output.

In the present A/D converter, as described above, the comparators for detecting redundancy bits are added to the low-order comparators, and thereby, it is adapted such that an H-level signal is output to the correction line V or VII when a low-order converted code outside the range of the high-order converted code (the hatched regions in FIG. 4) is output, and thus, the corresponding correction of the high-order converted code is made. Therefore, even when the sampling characteristic is degraded by the sampling performed at a high speed, a correct converted code can be obtained by virtue of the detection made at the low-order conversion.

As to the second and the fourth lines of the switching blocks, the direction of the reference voltage applied thereto is made opposite to that for the first and the third lines, restricted by the circuit configuration. Therefore, it should be noticed here that it is adapted, when the second line or the fourth line is selected, such that a signal of level "1" is supplied from an inverter 100 to the inverting gate 91 and ex-$OR_1$ and ex-$OR_2$, whereby the signals on the correction lines V and VII are inverted and the low-order two-bit converted code $D_3$, $D_4$ is also inverted.

Shown in FIG. 5 (comprising sectioned FIGS. 5A-5D) is an embodiment of the present invention as a modification of the A/D converter of FIG. 1. In FIG. 5, corresponding parts to those in FIG. 1 are denoted by corresponding reference numerals.

Figure 5B:
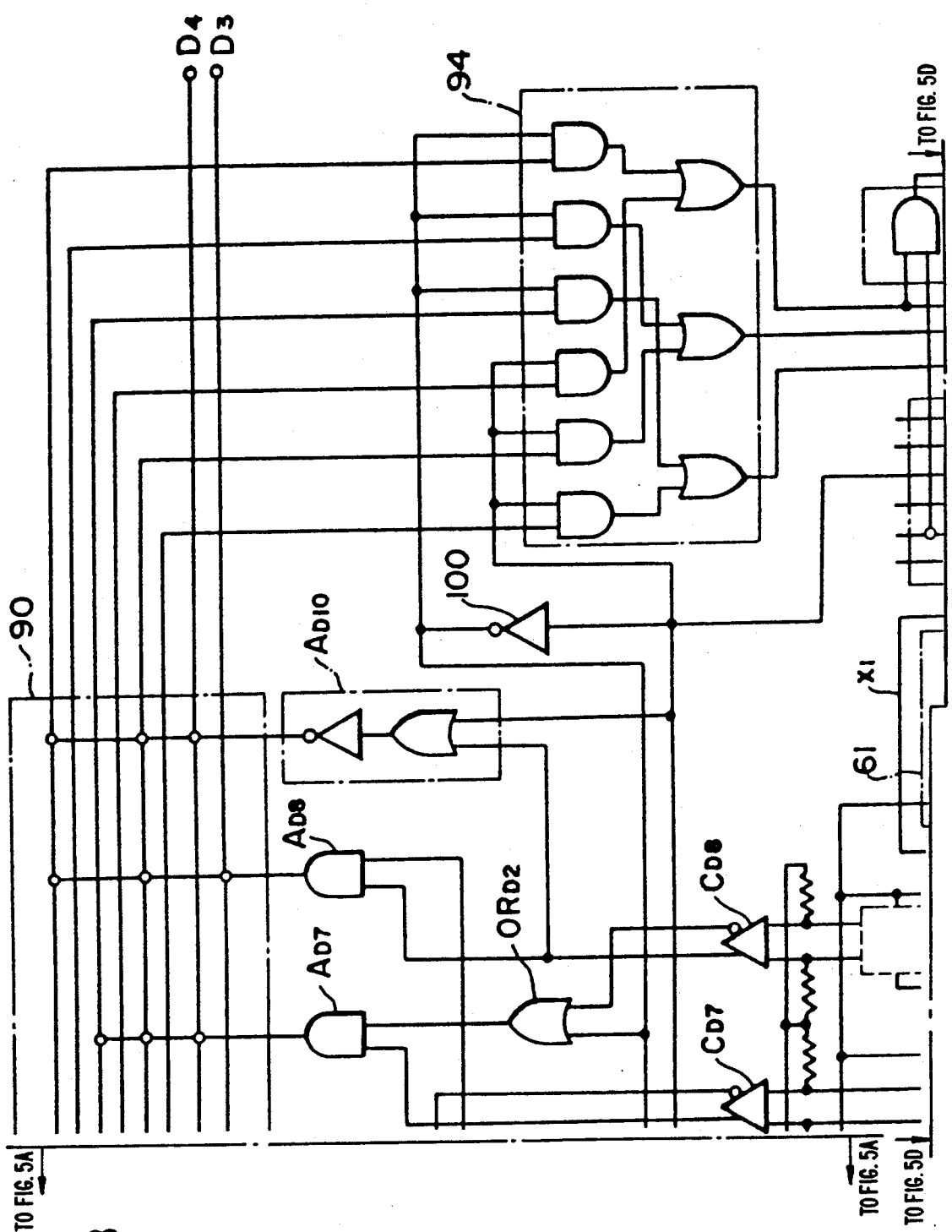
FIG. 5A and FIG. 5E are a sectioned basic circuit diagram showing an embodiment of the present invention and its explanatory drawing.
Figure 5C:
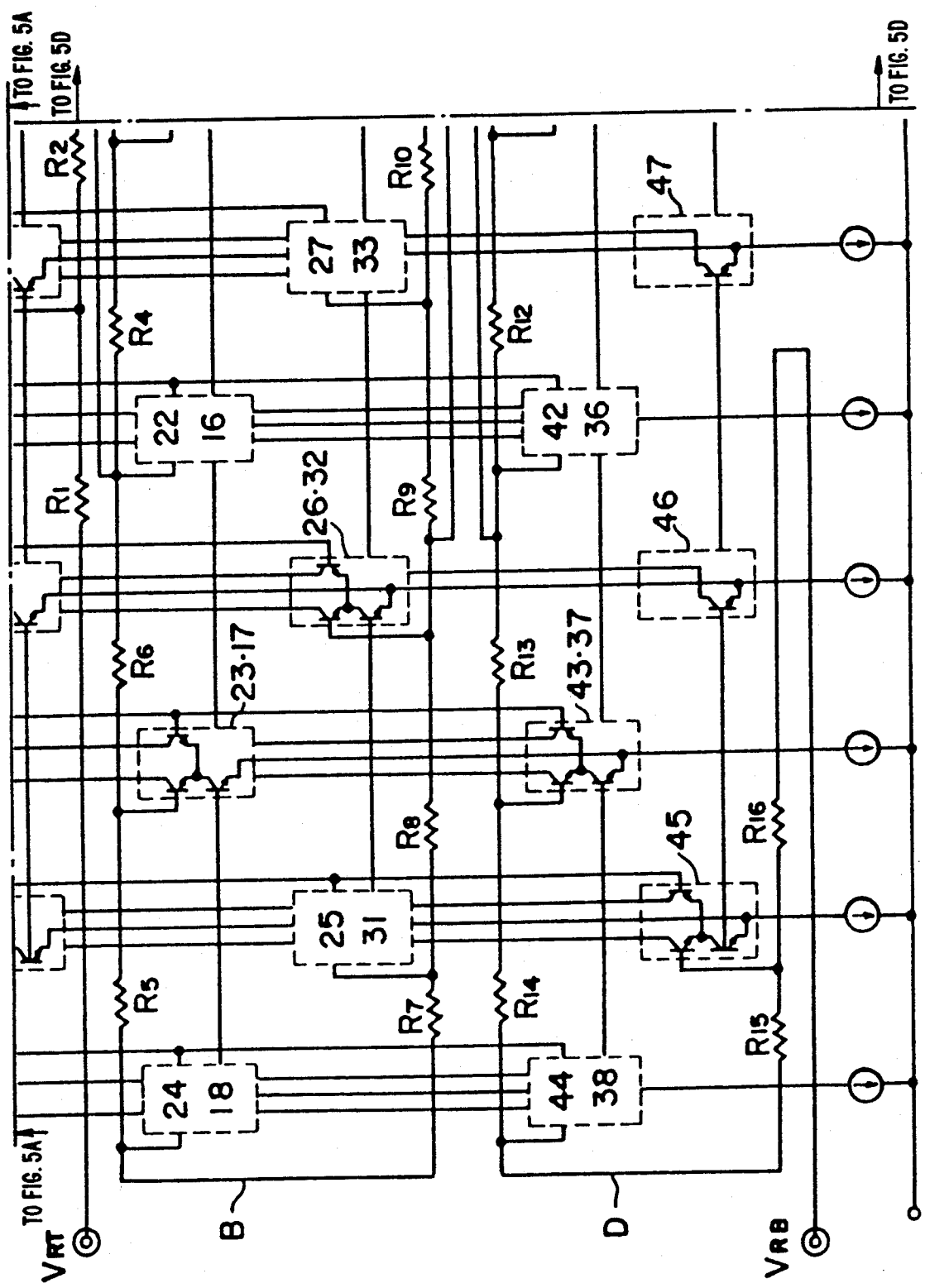
Figure 5D:
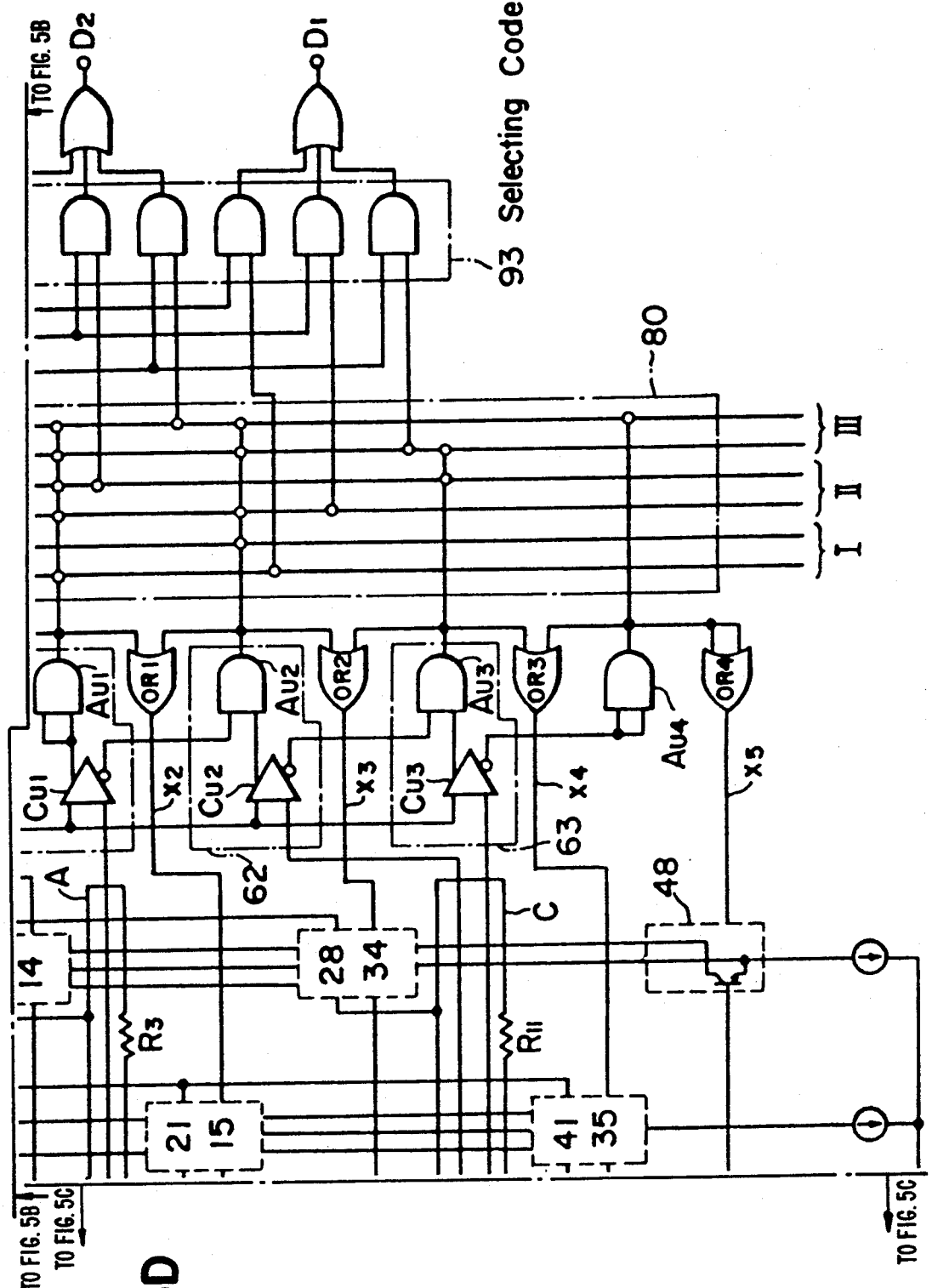
Figure 5E:
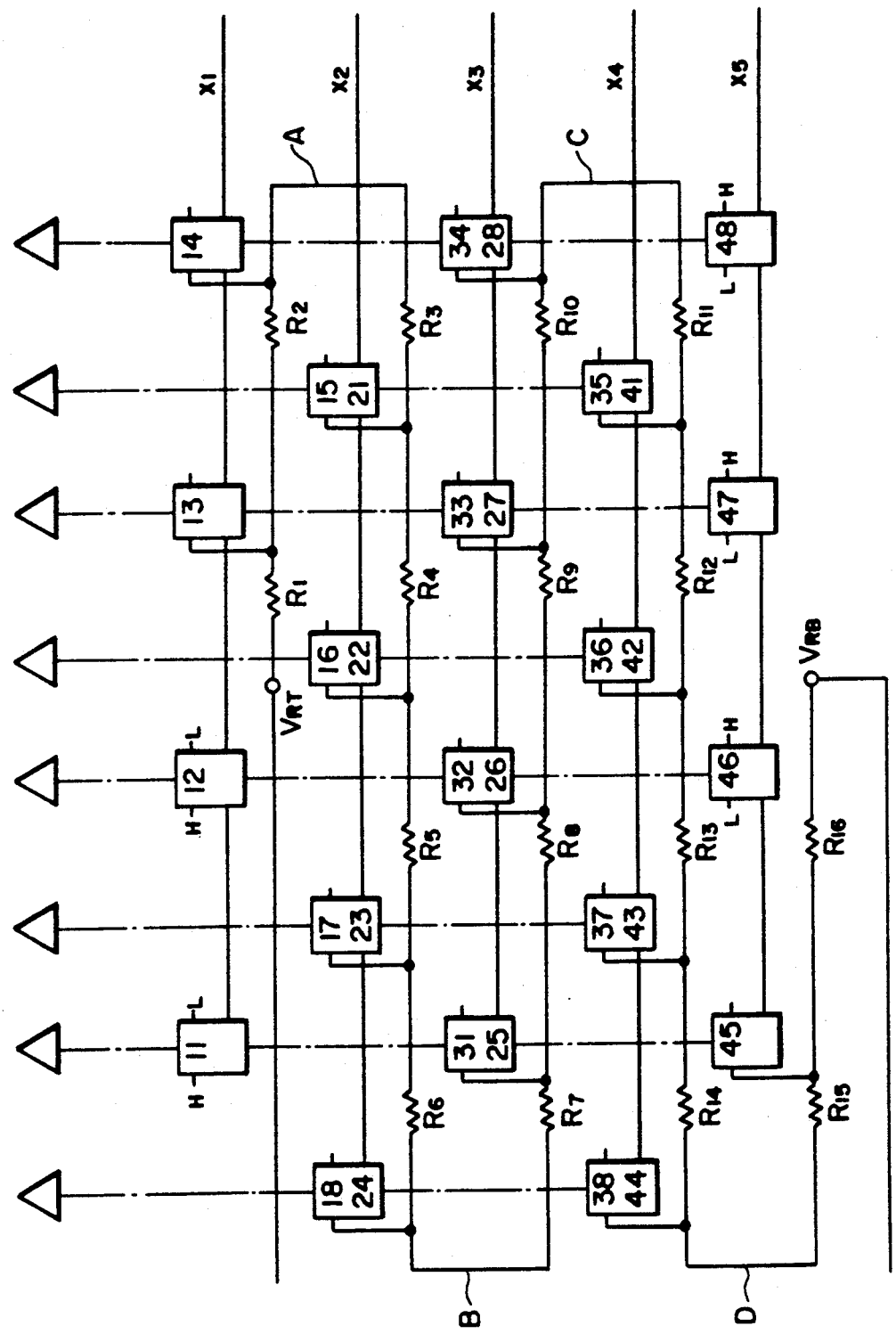

The embodiment of FIG. 5A is characterized in that the folded portions of the line of the reference resistors $R_1$-$R_{16}$ for dividing the reference voltage $V_{RT}$-$V_{RB}$ are shifted by half a period as shown in FIG. 5E.

More particularly, in the present embodiment, the junction point A of the reference resistors $R_2$-$R_3$, the junction point B of the reference resistors $R_6$-$R_7$, the junction point C of the reference resistors $R_{10}$-$R_{11}$, and the junction point D of the reference resistors $R_{14}$-$R_{15}$ are arranged to be the folded points, and consequently, the matrix circuit is changed from that of four lines to that of five lines.

Further, nine sets of switching blocks applied with the same reference voltage in FIG. 1, that is, the switching blocks 15 and 21, the switching blocks 16 and 22, the switching blocks 17 and 23, the switching blocks 25 and 31, the switching blocks 26 and 32, the switching blocks 27 and 33, the switching blocks 35 and 41, the switching blocks 36 and 42, and the switching blocks 37 and 43 are made common, whereby nine switching blocks are reduced. As a whole, the circuit is arranged in a 5-line×8-row matrix.

Further, there are provided four OR circuits $OR_1$-$OR_4$ on the output side of the high-order comparators 61, 62, and 63. In the range of the quantization level where the high-order converted code becomes [11], only the high-order AND gate $A_{U1}$ goes to a "1" level, whereby the first line and the second line of the switching blocks are actuated through control lines $x_1$ and $x_2$, and at this time, the switching blocks 13, 14, 15, and 16 are put into the mode for detecting the low-order converted code and the switching blocks 11, 12, 17, and 18 are put into the mode for detecting redundancy bits over and under the low-order converted code.

Similarly, in the range of the quantization level where the high-order converted code becomes [10], the high-order AND gate $A_{U2}$ becomes "1", whereby the second line and the third line of the switching blocks are actuated through control lines $x_2$ and $x_3$, and at this time, the switching blocks 23, 24, 25, and 26 are arranged to detect the low-order converted code and the switching blocks 21, 22, 27, and 28 are arranged to detect redundancy bits of the low-order converted code.

In like manner, the third line and the fourth line are actuated when the high-order converted code is [01] and the fourth line and the fifth line are actuated when the code is [00].

Thus, other switching blocks than the switching blocks 11, 12, 46, 47, and 48 (dummy switching blocks), which when actuated deliver a fixed output signal to low-order comparators, and the switching blocks 13, 14, and 45 serve dual functions to detect the low-order converted code and the redundancy bits.

Further, the use of the pair of differentially operating transistors is omitted in the dummy switching blocks 11, 12, 46, 47, and 48, and these switching blocks are adapted to directly supply signals at "H" and "L" level to the low-order comparator responding to control signals, and therefore, the wiring of the matrix circuit is made still simpler.

Further, the lines V, VI, and VII for correction signals, corresponding to those shown in FIG. 1, are each provided in two channels, (R) and (L). As described later, from a second encoder 90 for forming high-order bits, while the low-order converted code $D_3$, $D_4$ is output through the code line IV, two kinds of correction signals are output through six channels of correction lines V(R, L), VI(R, L), and VII(R, L) dependent on the selected line of switching blocks according to the high-order converted code, and these signals are supplied to the selecting gate 93 through a correction signal selector 94.

Operation in the above described A/D converter for obtaining the low-order converted code and the redundancy bits will be described below with reference to FIG. 6A and FIG. 6B.

When the high-order converted code [11] or [01] is output in FIG. 5, the output of the AND gate $A_{U1}$ or $A_{U3}$ becomes "1". At this time, eight switching blocks SB 1-8 arranged in the form of the letter U, laid on its side and opening to the left, as shown in FIG. 6A are actuated (this mode will hereinafter be referred to as "R-mode").

In the R-mode, according to the input signal (H) to and the output signal (L) from the inverter 100, the output of the output gate $A_{D10}$ in FIG. 5 is always held at a "0" level and is negligible, and the output of the OR circuit $OR_{D1}$ becomes "1", and hence, the AND gate $A_{D2}$, as denoted by $A_{d1}$ in FIG. 6A, changes its state dependent only on the output signal of the low-order comparator $C_{D2}$.

While the OR circuit $OR_{D2}$ becomes a through circuit, the output gate $A_{D0}$ can be expressed as an AND gate $A_{d9}$ which outputs the inverted voltage in the low-order comparator $C_{D1}$ as it is.

Therefore, when the input analog signal is higher than the reference voltage supplied to each of the switching blocks 1-8, that is, when positive phase output signal of each of the low-order comparators $C_{D1}$-$C_{D8}$ becomes "H", only the AND gate $A_{d1}$ becomes "1", and thereby, the low-order converted code $D_3.D_4 = $ [01] is output from the second encoder 90 and a singal being +1 is supplied from the correction signal line VII(R) to the correction signal selector 94.

Then, the code on the line III of the first encoder 80 is selected as described before and the correction adding +1 to the high-order converted code is made.

As the level of the analog signal is lowered, the outputs of the switching blocks come to be inverted to the L level in the order from the switching block having the highest reference voltage as shown in FIG. 7 and the signal "1" which was output from the AND gate $A_{d1}$ comes to be output from $A_{d2}$, $A_{d3}$, . . . in the named order.

Consequently, the low-order converted code $D_3.D_4$ is changed from [01] to [00], [11], [10], . . . .

When the output signal of the AND gate $A_{d3}$-$A_{d6}$ is "1", the low-order code [11], [10], [01], or [00] is obtained and this is the case where the low-order converted code is obtained within the range of the quantization level of the high-order converted code. Hence, "1" is obtained from the correction signal line VI(R) and no correction is made.

However, when the AND gate $A_{d1}$, $A_{d2}$ becomes "1", a signal "1" is output from the correction line VII(R), whereby 1 is added to the high-order converted code, and when the AND gate $A_{d7}$-$A_{d9}$ becomes "1", the signal "1" is output from the correction line V(R), whereby −1 is added to the high-order converted code.

Now, the case of an L-mode where a signal at a "1" level appears at the output of the high-order AND gate $A_{U2}$ or $A_{U4}$ will be described with reference to FIG. 6B.

In the case of the L-mode, the output gate $A_{D0}$ in FIGS. 5A-5D can be omitted because its output signal is always "0" according to the input (L) to and the output (H) from the inverter 100.

Figure 6B:
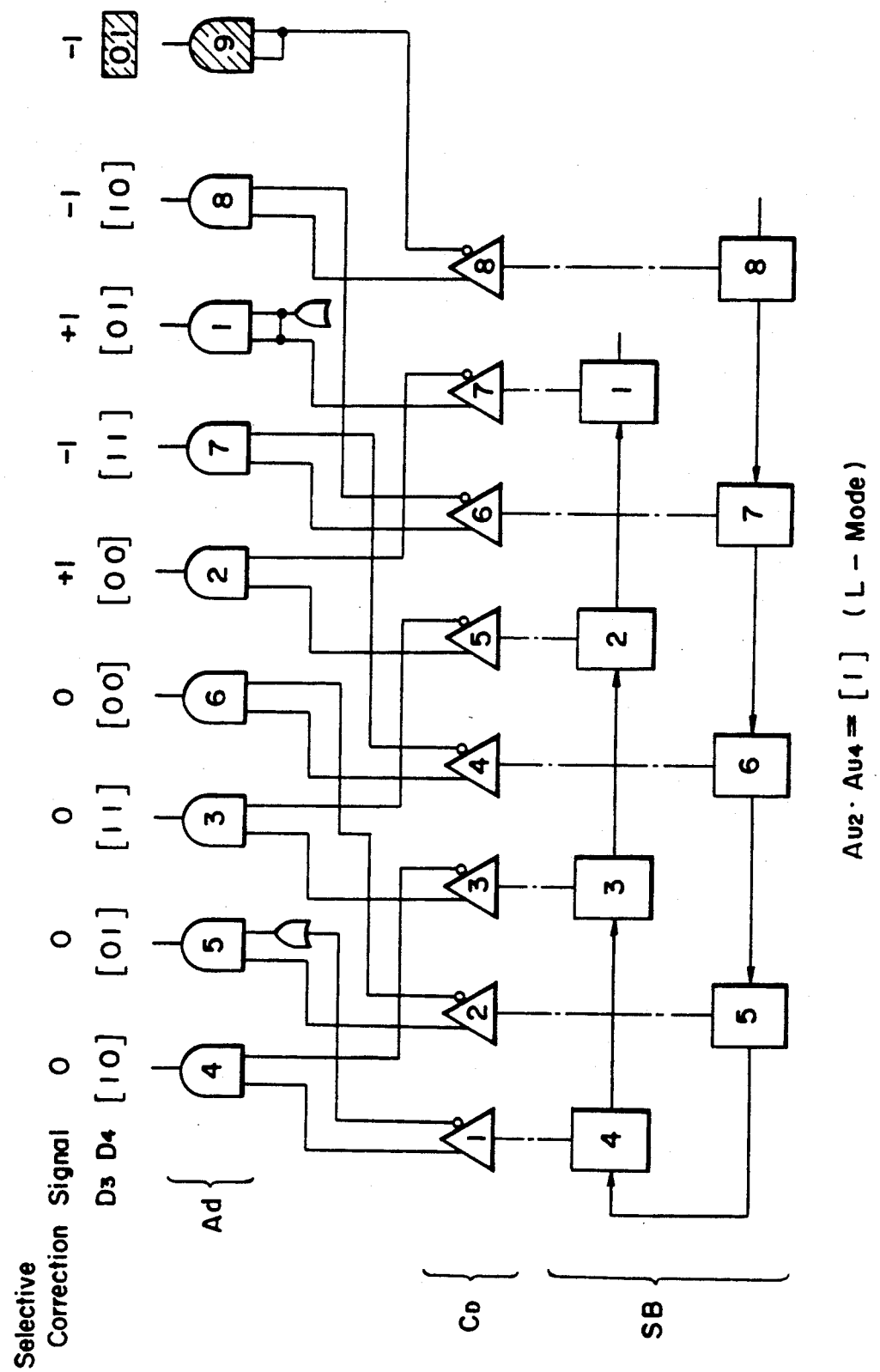
Figure 8A:
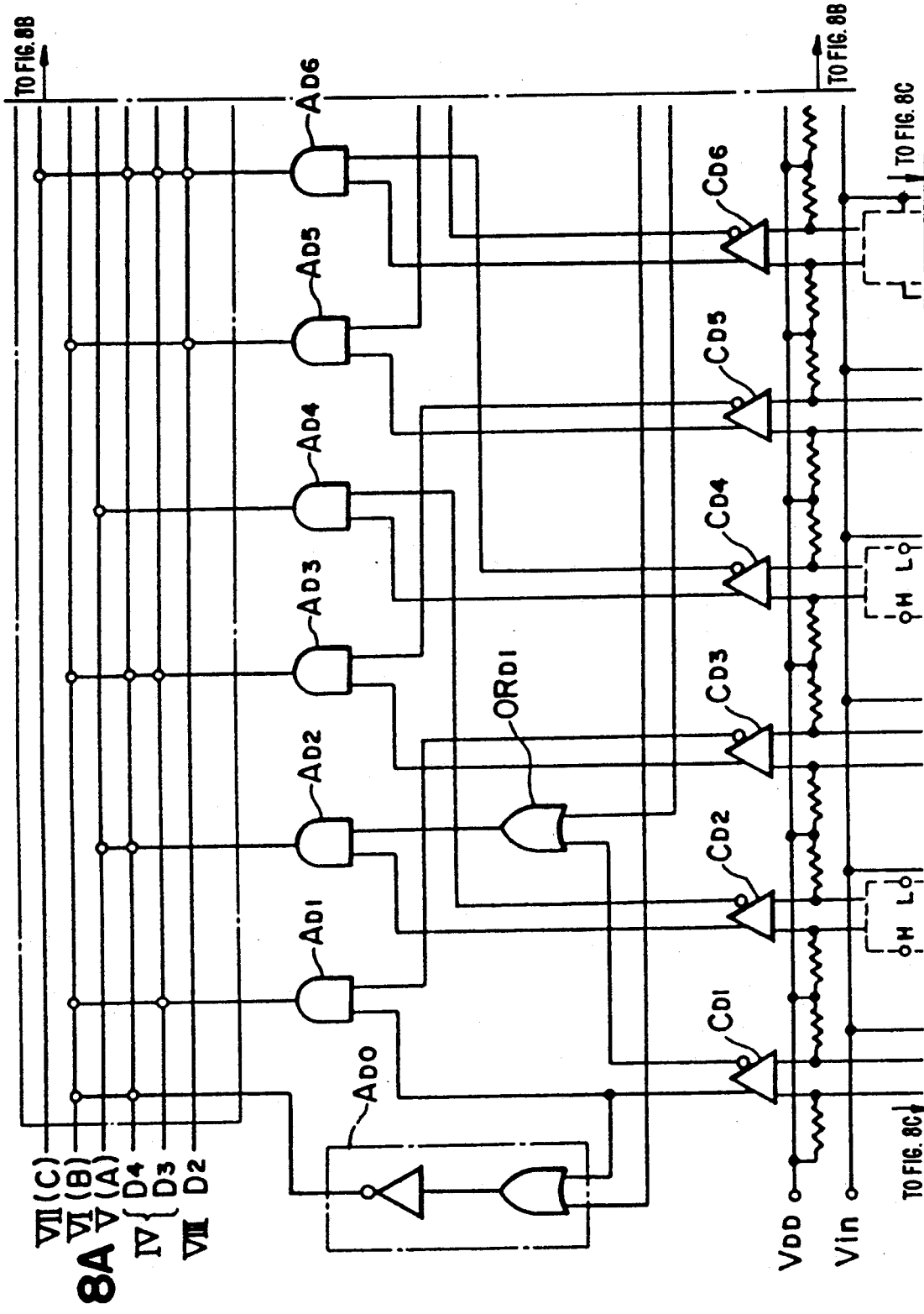
FIG. 8 (comprised of sectioned FIGS. 8A-8D) is a circuit diagram showing an embodiment of the present invention.
Figure 8B:
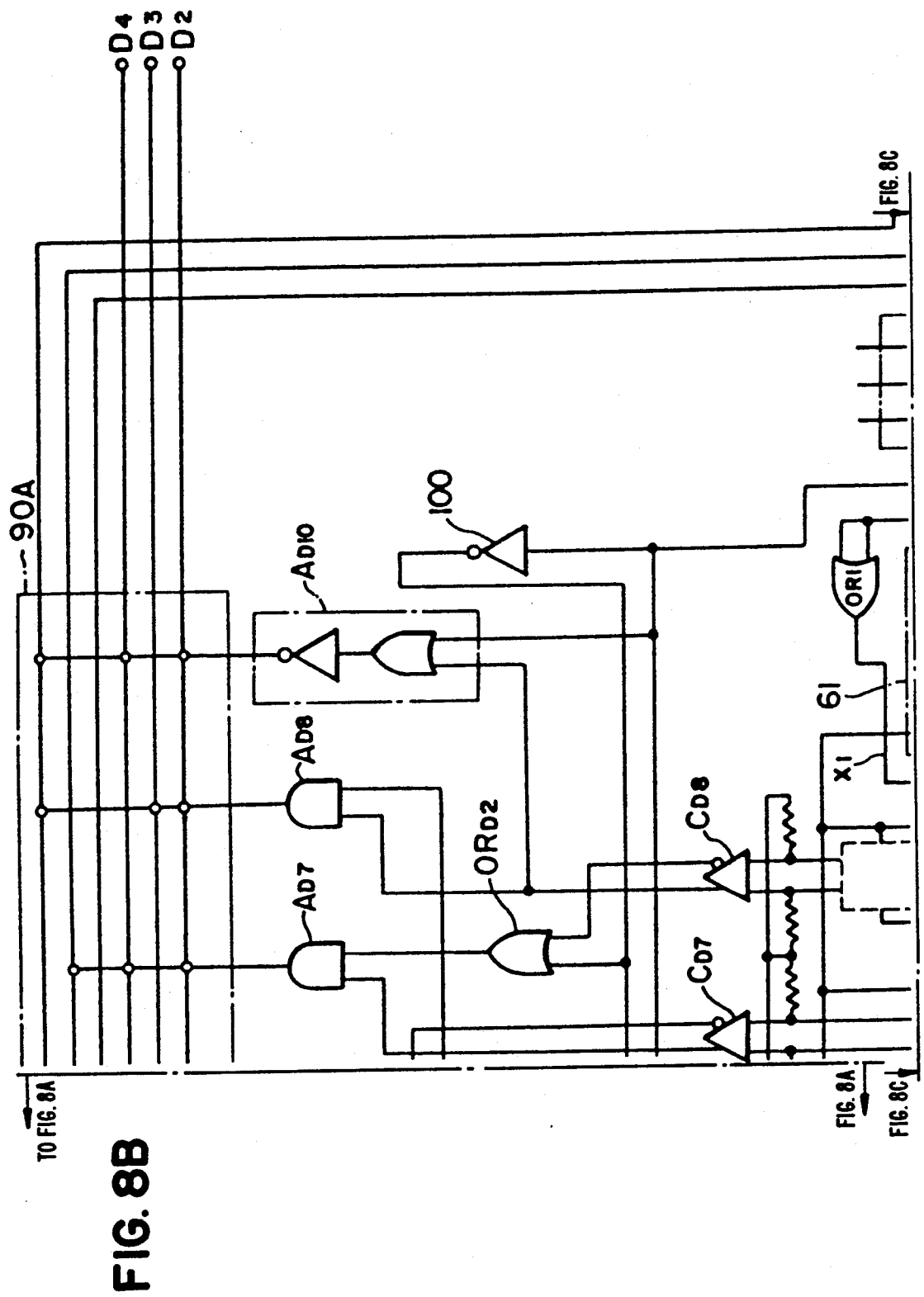
Figure 8C:
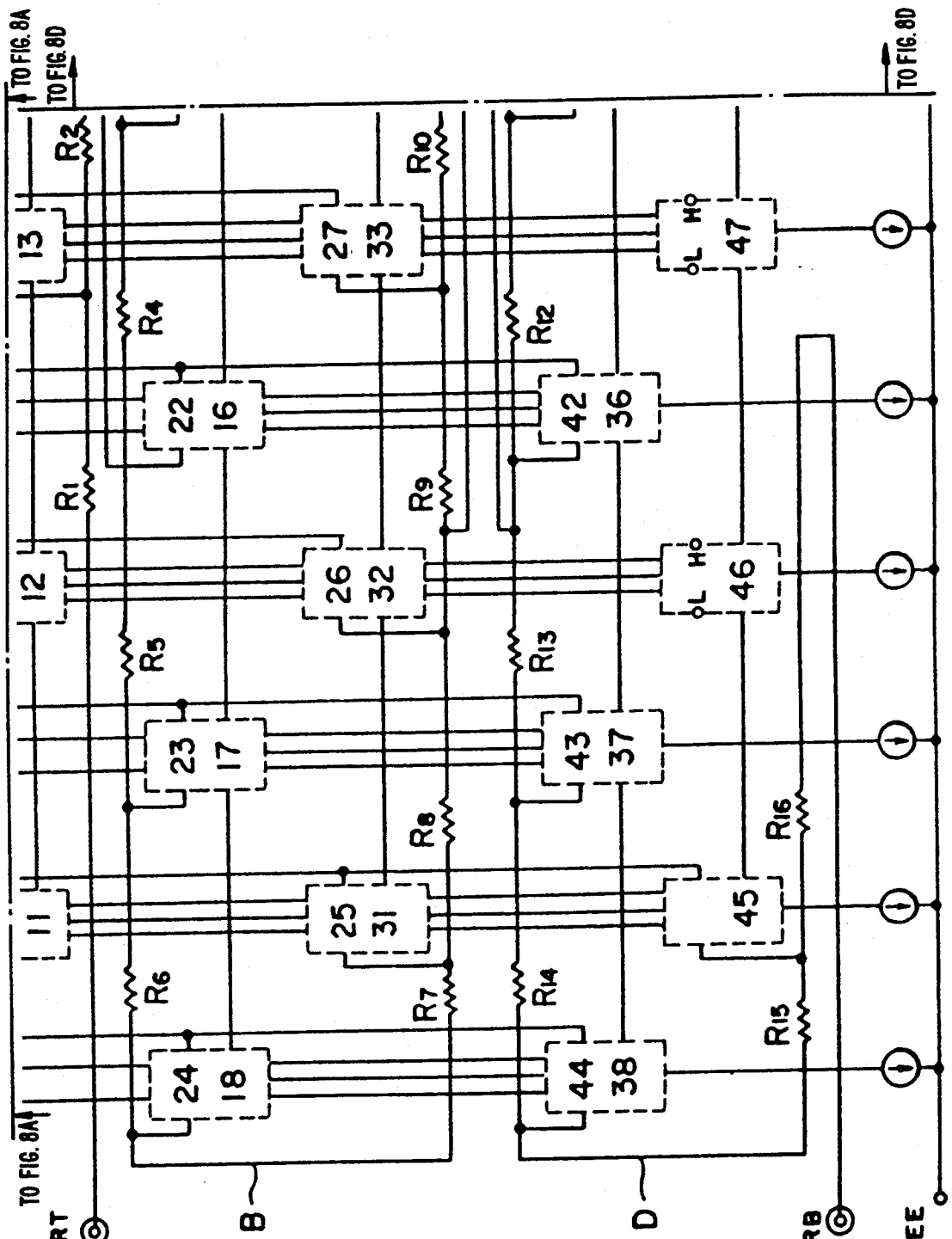
Figure 8D:
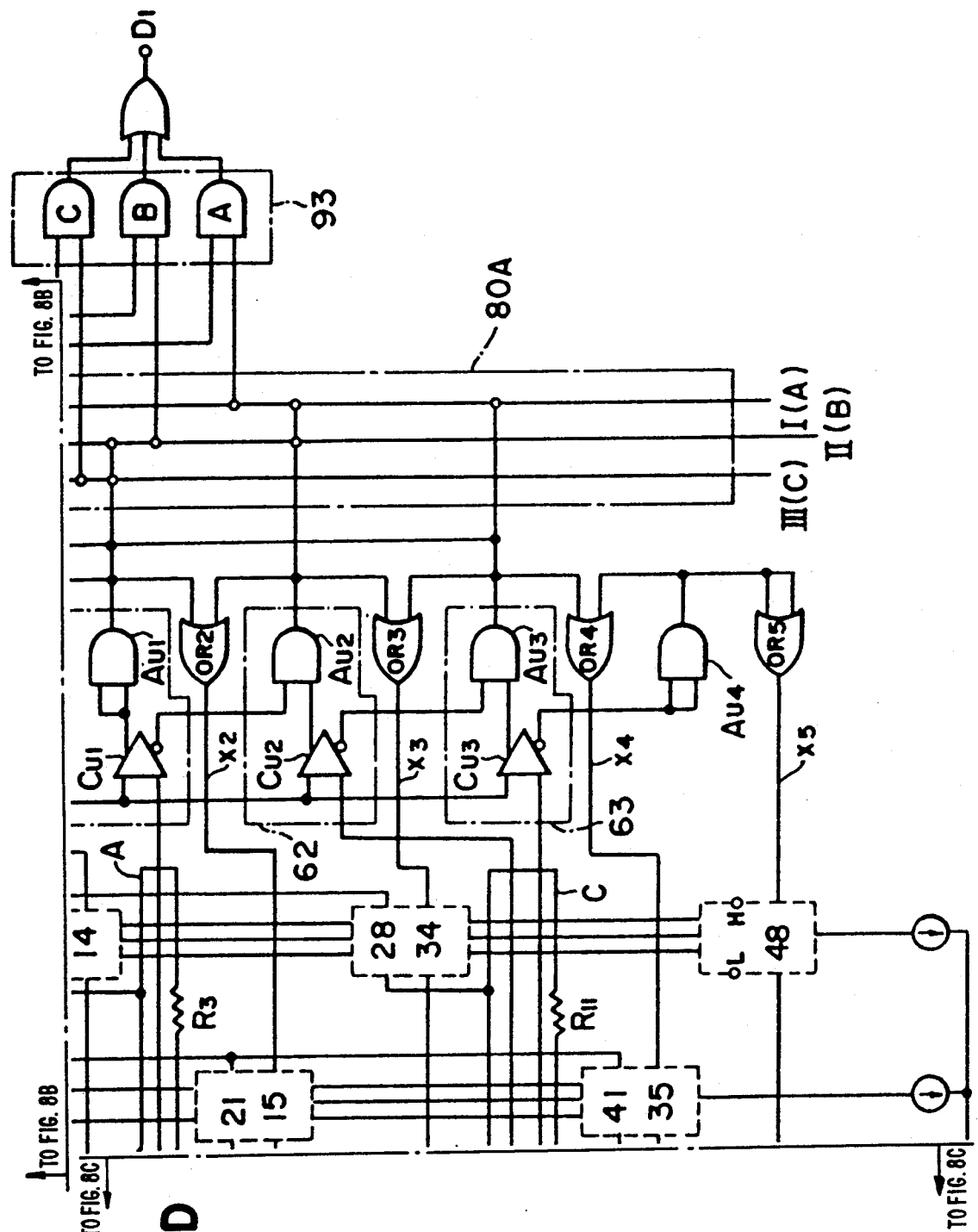

Further, while the OR circuit $OR_{D1}$ becomes a through circuit, the output of the OR circuit $OR_{D2}$ always becomes 1, and hence, the AND gate $A_{D7}$ in FIG. 5, as denoted by $A_{d1}$ in FIG. 6B, changes its state dependent on the output of the low-order comparator $C_{D7}$.

Further, the output gate $A_{D10}$ can be expressed as the AND gate $A_{d9}$ outputting the inverted output of the low-order comparator $C_{D8}$ as it is.

Consequently, switching blocks SB 1-8 in the form of the letter U, laid on its side and opening to the right, as shown in FIG. 6B are selected, and according as the switching blocks 1-8 are successively inverted from H level to L level dependent on the level of the analog signal, the AND gates $A_{d1}$-$A_{d9}$ successively output "1" in the order of the numerals.

According to such output of the AND gates $A_{d1}$-$A_{d9}$, the low-order converted code $D_3.D_4$ as shown in FIG. 7 is adapted to be obtained from the second encoder 90.

In this L-mode, the correction signal line V(L), VI(L), or VII(L) is selected by the correction signal selector 94, whereby the high-order converted code $D_1.D_2$ is corrected as in the R-mode.

According to the embodiment of the invention shown in FIG. 5 as described above, the train of the switching blocks selected according to the high-order converted code is arranged in two lines by eight rows, and therefore, the wiring distances for supplying the reference voltage to each of the switching blocks become even and shortened.

However, in the circuit shown in FIG. 5, it is arranged such that three sets of high-order converted codes are output from the lines I, II, and III of the high-order comparator 80, and in addition, six correction signals are obtained from the encoder 90, and therefore, the correction circuit has a somewhat complex configuration.

An embodiment further improved to remove such difficulty is shown in FIG. 8, (comprised of sectioned FIGS. 8A–8D) in which corresponding parts to those in FIG. 5 are denoted by corresponding reference numerals.

In the embodiment of FIG. 8, a high-order LSB line VIII for outputting a signal of the low-order bit $D_2$ (LSB) of the high-order converted code is added to the low-order encoder 90A.

While, as described above, the LSB ($D_2$) of the high-order converted code is output from the high-order LSB line VIII, it is adapted such that only the bit $D_1$ (MSB) of the high-order converted code is obtained on the line I(A), II(B), III(C) and input to the selecting gate 93.

Further, the low-order encoder 90A is arranged such that the bit $D_2$ of the high-order converted code from the high-order LSB line VIII becomes "1" when the outputs of the AND gates $A_{D5}$–$A_{D8}$ and the output gate $A_{D10}$ of FIG. 5 are "1".

Further, in the embodiment of FIG. 8, the lines V(A), VI(B), and VII(C) for obtaining correction signals from the low-order encoder 90A are made up of three lines, and the circuit is simplified such that the bit $D_1$ (MSB) of the high-order converted code can be corrected by the signals output from the lines V(A), VI(B), and VII(C) as described later.

The low-order converted codes are divided into $8(=2^{b+1})$ sets as shown in FIG. 9.

The sets including low-order data of which all the digits are [0] are grouped as a group A, the sets including low-order data of which all the digits are [1] are grouped as a group C, and the sets not belonging to any of the above two groups are grouped as a group B.

The correction lines V(A), VI(B), and VII(C) are encoded with the low-order converted codes classified in groups A, B and C as above, such that, when the converted code belonging to the group A, B, C is output as redundancy bits, a signal of "1" is output at the same time, and according to this correction signal, the high-order converted code ($D_1$) is corrected in the selecting gate 93.

In this way, it is arranged in the embodiment of FIG. 8 such that the low-order converted code $D_3$, $D_4$, the LSB ($D_2$) of the high-order converted code, and the correction signal A, B, C added through the above described grouping are obtained from the low-order encoder 90A.

Figure 10:
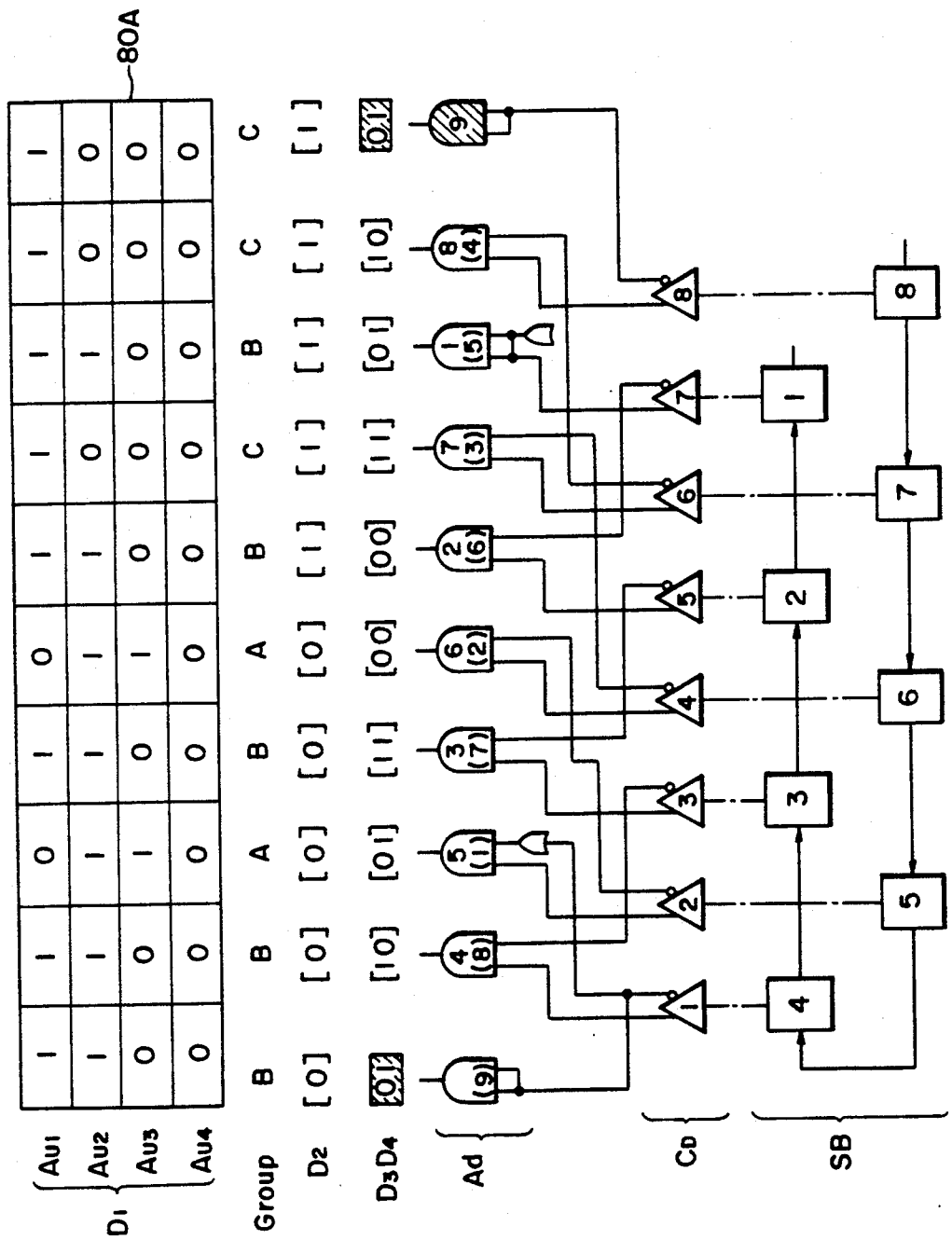
FIG. 10 is an explanatory drawing showing relationships between groups and correction of high-order converted codes.
Figure 12:
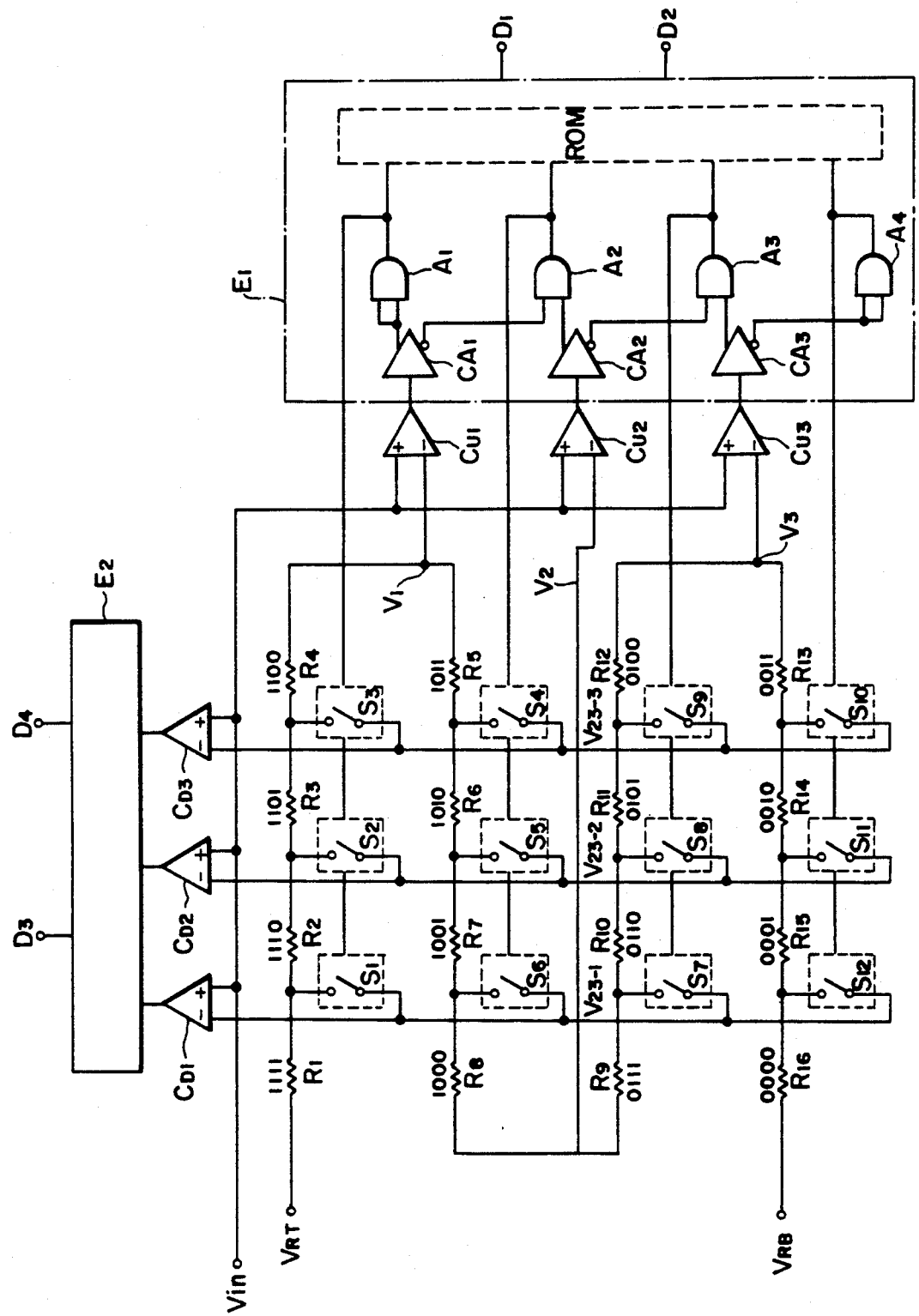
FIG. 12 is a block diagram of a prior-art series-parallel type A/D converter.

In FIG. 10 are shown a consolidated diagram of the above described FIG. 6A and FIG. 6B and output data $D_3$, $D_4$, and $D_2$ of the low-order encoder 90A at the time when any of the AND gates $A_{d1}$–$A_{d9}$ [numerals in parentheses ( ) indicate the R-mode] becomes 1, as well as the group A, B, C of the low-order converted code and data of the high-order encoder 80A corresponding to the group A, B, C.

As understood from FIG. 10, the high-order converted code $D_1$ output from the high-order encoder 80A is selected both by the high-order AND gate $A_{U1}$–$A_{U4}$ and according to the group A, B, C of the low-order converted code.

For example, when the high-order AND gate $A_{U2}$ is "1", $D_1$ being "0" is output when low-order converted code encoded by the AND gate $A_{d9}$, $A_{d8}$, $A_{d7}$ (group C) is output, but $D_1$ being "1" is output with the AND gate $A_{d1}$–$A_{d6}$ providing the low-order converted code belonging to the group A or B. Therefore, as seen from FIG. 9, when "1" is output at the high-order AND gate $A_{U2}$ and in addition the low-order converted code of group C is output as a redundancy code, the high-order converted code $D_1$ is corrected to "0".

However, when the low-order converted code belonging to group B, may it equally be a redundancy code, is output, $D_1 =$ "1" is kept uncorrected.

Likewise, when the high-order AND gate $A_{U3}$ becomes "1" (R-mode), the redundancy code is output from the low-order AND gate $A_{d(1)}$, $A_{d(2)}$, and since this redundancy code belongs to group A, the code $D_1$ is corrected to "1".

However, with other AND gate $A_{d(3)}$–$A_{d(8)}$ outputting the low-order converted code belonging to group B or group C, the selection is made so that the code $D_1$ is corrected to 0.

FIG. 11 is a list of low-order converted codes and high-order converted codes obtained in the case where the A/D converted code is arranged to be of six bits.

In a six-bit series-parallel type A/D converter, the high-order code and the low-order code are generally set to three bits each. In the present embodiment of the invention, however, the high-order code is set to be two-bit code $D_1$, $D_2$, and the low-order code is set to be four-bit code $D_3$, $D_4$, $D_5$, and $D_6$. The group including such codes whose low-order data $D_3$, $D_4$, $D_5$, and $D_6$ are all "0" is classified as group A, the group including such codes whose data are all "1" is classified as group C, and other group is classified as group B.

The high-order two bits $D_1$ and $D_2$ are encoded, as shown in FIG. 11, such that three sets of high-order data I(A), II(B), and III(C) are each output from the high-order AND gate $A_{U1}$–$A_{U8}$.

Then, according to the groups A, B, and C to which the low-order converted codes ($D_3$–$D_6$) belong and the high-order AND gate $A_u$–$A_{U8}$, any of the above described three sets of high-order codes I(A), II(B), and III(C) is selected by the selecting gate 93 and output as the high-order converted code.

The six-bit A/D converter of the present embodiment can also have its correction circuit simplified because the high-order converted code is arranged to be selected according to a signal on three-wire correction lines V(A), VI(B), and VII(C).

Further, even if the converted code is made to be generally of n bits, the A/D converter according to the present invention can be arranged, with the low-order converted code formed of b bits, by dividing the codes into $2^b$ sets and classifying such sets into three groups, A, B, and C, in the same way as described above.

The correction circuit becomes simplified according as the number of bits of the low-order converted code is increased. But, if the number of bits of the low-order converted code is made greater, the number of the low-order comparators and the switching blocks becomes greater.

Therefore, it is generally preferred to arrange such that switching blocks along two lines each are actuated and the LSB of the high-order converted code is output from the low-order encoder. By such arrangement, effective operation of the switching blocks and simplification of the correction circuit can be achieved to the utmost degree.

In a series-parallel type A/D converter for converting an analog signal to a digital signal in two steps, the A/D converter according to the present invention, as described in the foregoing, has switching blocks disposed in a matrix array, and is adapted such that the folded point of the reference resistor line is shifted by half a period and the reference voltages are supplied from junctions of the reference resistors to each of the switching blocks, the switching blocks along two lines each are actuated at a time, the LSB of the high-order converted code is output from the encoder for the low-order comparator, and the low-order converted code is divided into groups to thereby provide correction signals. Hence, such an effect can be especially obtained that the correction circuit for the high-order converted code can be simplified.

What is claimed is:

1. An analog-to-digital converter comprising:
   switching blocks arranged in a matrix array and actuated for each line by a high-order converted output signal for comparing each of a plurality of reference voltages provided by dividing a reference potential by a line of n reference resistors connected in series with an input signal to be converted;
   high-order comparators each thereof comparing a reference voltage on a specific point on each line of said switching blocks with said input signal to be converted for obtaining a high-order a-bit converted code; and
   low-order comparators each thereof supplied with outputs of said switching blocks along each row in common for obtaining a low-order b-bit converted code and a redundancy c-bit converted code for the region outside the range of conversion of the high-order comparator; wherein
   said line of said reference resistors is set up by being folded at certain positions so that the points where said reference voltage has its maximum value and minimum value are located in the middle point of the lines of said switching blocks in the matrix array, and wherein n, a, b and c are positive integers.

2. An analog-to-digital converter comprising:
   switching blocks arranged in a matrix array and actuated for each line by a high-order converted output signal for comparing each of a plurality of reference voltages provided by dividing a reference potential by a line of n reference resistors connected in series with an input signal to be converted;
   high-order comparators each thereof comparing a reference voltage on a specific point on each line of said switching blocks with said input signal to be converted for obtaining a high-order a-bit converted code; and
   low-order comparators each thereof supplied with outputs of said switching blocks along each row in common for obtaining a low-order b-bit converted code and a redundancy c-bit converted code for the region outside the range of conversion of the high-order comparator; wherein
   said line of said reference resistors is folded at certain positions so that the points where said reference voltage has its maximum value and minimum value are located in the middle point of the lines of said switching blocks in the matrix array, two lines each of said switching blocks are actuated at a time, and the rows of switching blocks to be applied with the same value of reference voltage are combined into one, and wherein n, a, b, and c are positive integers.

3. An analog-to-digital converter comprising:
   switching blocks arranged in a matrix array and actuated for each line by a high-order converted output signal for comparing each of a plurality of reference voltages provided by dividing a reference potential by a line of n reference resistors connected in series with an input signal to be converted;
   high-order comparators each thereof comparing a reference voltage on a specific point on each line of said switching blocks with said input signal to be converted for obtaining a high-order a-bit converted code; and
   low-order comparators each thereof supplied with outputs of said switching blocks along each row in common for obtaining a low-order b-bit converted code and a redundancy c-bit converted code for the region outside the range of conversion of the high-order comparator; wherein
   said analog-to-digital converter is provided with high-order encoders for obtaining $(a-1)$-bit converted code and a low-order encoders for obtaining $(b+1)$-bit converted codes, and said converter is adapted such that the converted codes obtained from said low-order encoders are sequentially divided into $2^b$ groups, of which groups including low-order converted codes whose converted bits are all "0" are classified as a first group (A), groups including low-order converted codes whose converted bits are all "1" are classified as a second group (B), and others not belonging to either said first or second groups as a third group (C), and, when said first or third groups is output as a redundancy code, the said high-order $(a-1)$-bit converted code is corrected by a correction signal, and wherein n, a, b, and c are positive integers.

* * * * *